US008038496B2

(12) United States Patent
Sakakura et al.

(10) Patent No.: US 8,038,496 B2
(45) Date of Patent: Oct. 18, 2011

(54) METHOD OF MANUFACTURING A LIGHT EMITTING DEVICE AND USING AN ELECTRODE LAYER AS A MASK DURING MANUFACTURING

(75) Inventors: Masayuki Sakakura, Ebina (JP); Shuhei Takahashi, Atsugi (JP); Kazuko Ikeda, Machida (JP); Tomoya Futamura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 427 days.

(21) Appl. No.: 12/219,648

(22) Filed: Jul. 25, 2008

(65) Prior Publication Data
US 2008/0293322 A1    Nov. 27, 2008

Related U.S. Application Data

(63) Continuation of application No. 11/079,280, filed on Mar. 15, 2005, now Pat. No. 7,423,373.

(30) Foreign Application Priority Data

Mar. 26, 2004  (JP) .................. 2004-091710

(51) Int. Cl.
*H01L 51/56* (2006.01)
(52) U.S. Cl. .......................................... 445/24; 427/66
(58) Field of Classification Search ............ 445/24, 445/25; 427/66; 313/500–512
See application file for complete search history.

(56) References Cited

U.S. PATENT DOCUMENTS

| 5,882,761 | A | 3/1999 | Kawami et al. |
| 6,664,732 | B2 | 12/2003 | Yamazaki et al. |
| 6,689,492 | B1 | 2/2004 | Yamazaki et al. |
| 6,828,727 | B2 | 12/2004 | Yamazaki |
| 6,861,670 | B1 | 3/2005 | Ohtani et al. |
| 6,861,710 | B2 | 3/2005 | Murakami et al. |

(Continued)

FOREIGN PATENT DOCUMENTS

CN    1353464    6/2002

(Continued)

OTHER PUBLICATIONS

Office Action (Application No. 200510059473.X) Dated May 30, 2008.

(Continued)

*Primary Examiner* — Mariceli Santiago
(74) *Attorney, Agent, or Firm* — Eric J. Robinson; Robinson Intellectual Property Law Office, P.C.

(57) ABSTRACT

A light emitting device of the invention includes a thin film transistor, an insulating layer covering the thin film transistor, an electrode which is electrically connected to the thin film transistor through a contact hole formed on the insulating layer, and a light emitting element formed by interposing a light emitting layer between a first electrode which is electrically connected to the electrode and a second electrode. The light emitting device further includes a layer formed of a different material from that of the insulating layer only between the electrode and the first electrode over the insulating layer and the insulating layer. The structure of the light emitting device and its manufacturing method reduces the amount of water remaining in the light emitting device and suppresses the deterioration of the light emitting element due to water remaining in the light emitting device.

16 Claims, 13 Drawing Sheets

U.S. PATENT DOCUMENTS

| | | |
|---|---|---|
| 6,897,608 B2 | 5/2005 | Yamazaki et al. |
| 6,903,377 B2 | 6/2005 | Yamazaki et al. |
| 7,033,848 B2 | 4/2006 | Murakami et al. |
| 7,034,456 B2 | 4/2006 | Yamazaki et al. |
| 7,037,157 B2 | 5/2006 | Murakami et al. |
| 7,042,024 B2 | 5/2006 | Yamazaki et al. |
| 7,147,530 B2 | 12/2006 | Yamazaki et al. |
| 7,288,477 B2 | 10/2007 | Choi et al. |
| 7,294,517 B2 | 11/2007 | Takayama et al. |
| 7,303,455 B2 | 12/2007 | Murakami et al. |
| 7,897,979 B2 | 3/2011 | Yamazaki et al. |
| 2004/0079950 A1 | 4/2004 | Takayama et al. |
| 2005/0093432 A1* | 5/2005 | Yamazaki et al. ............ 313/503 |
| 2005/0093436 A1 | 5/2005 | Yamazaki |
| 2005/0098894 A1 | 5/2005 | Ohtani et al. |
| 2005/0206309 A1 | 9/2005 | Shibasaki et al. |
| 2005/0224820 A1 | 10/2005 | Yamazaki et al. |
| 2006/0006424 A1 | 1/2006 | Yamazaki et al. |
| 2006/0141645 A1 | 6/2006 | Yamazaki et al. |
| 2006/0151789 A1 | 7/2006 | Murakami et al. |

FOREIGN PATENT DOCUMENTS

| | | |
|---|---|---|
| EP | 0 776 147 A1 | 5/1997 |
| EP | 0 776 147 B1 | 5/1997 |
| EP | 1041622 A | 10/2000 |
| EP | 1385209 A | 1/2004 |
| JP | 59-098496 A | 6/1984 |
| JP | 61-179698 U | 11/1986 |
| JP | 07-169567 | 7/1995 |
| JP | 09-148066 | 6/1997 |
| JP | 2002-203682 A | 7/2002 |
| JP | 2004-063461 A | 2/2004 |
| JP | 2004-071558 A | 3/2004 |
| JP | 2005-266667 A | 9/2005 |

OTHER PUBLICATIONS

Chinese Office Action (Application No. 200910132593.6) Dated Jul. 7, 2010.

* cited by examiner

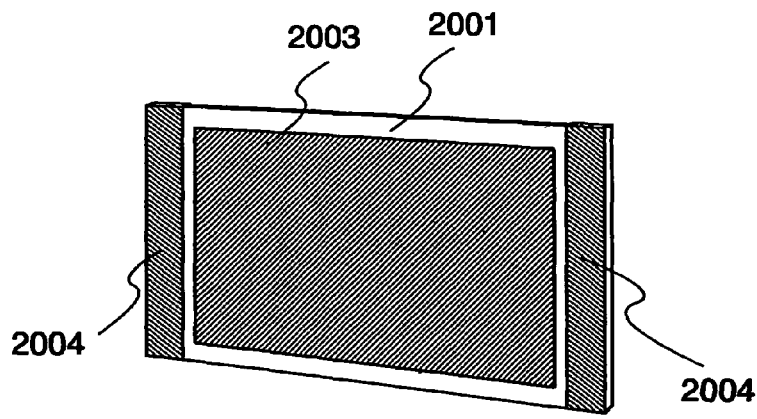
FIG. 7A
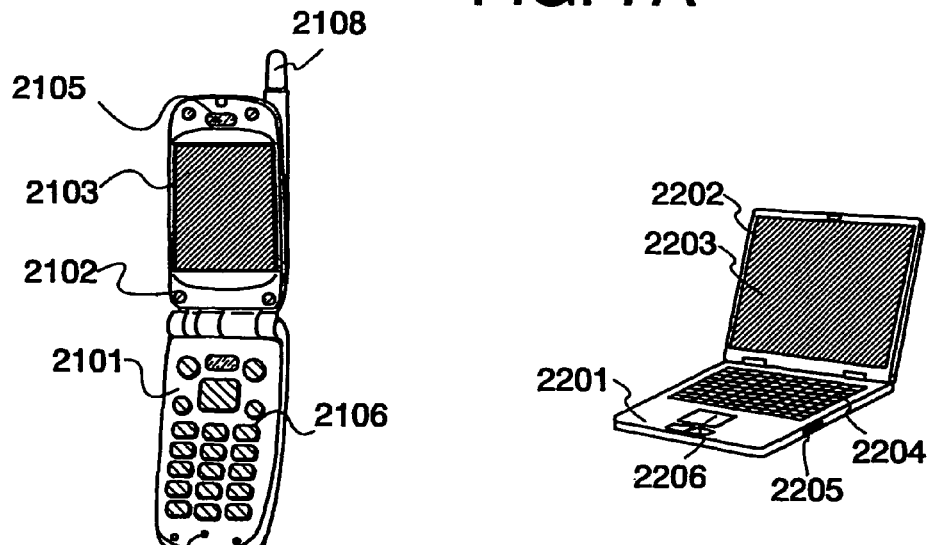
FIG. 7B
FIG. 7C
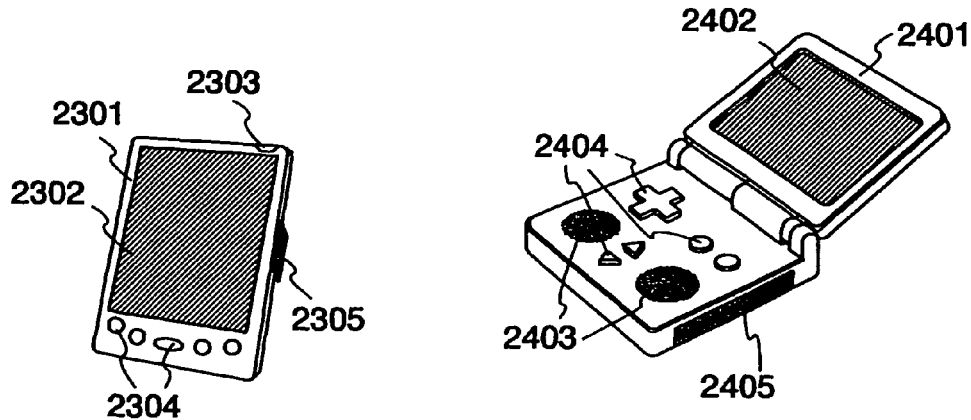
FIG. 7D
FIG. 7E

METHOD OF MANUFACTURING A LIGHT EMITTING DEVICE AND USING AN ELECTRODE LAYER AS A MASK DURING MANUFACTURING

This is a continuation application of U.S. patent application Ser. No. 11/079,280, filed on Mar. 15, 2005, now U.S. Pat. No. 7,423,373, issued on Sep. 9, 2008.

BACKGROUND OF THE INVENTION

1. Field of the Invention

The present invention relates to a display device which is manufactured by using an element having a light emitting material interposed between electrodes and emitting light by applying an electric current between the electrodes (light emitting element).

2. Description of the Related Art

In recent years, a thin lightweight display using a light emitting element has been actively developed. The light emitting element is manufactured by interposing a material which emits light by applying an electric current between a pair of electrodes. Since the light emitting element itself emits light unlike in the case of liquid crystal, a light source such as back light is not required, and the element is very thin. Therefore, it is extremely advantageous to manufacture a thin lightweight display.

However, one background of not reaching practical use yet while having such big advantages is a problem of reliability. The light emitting element often deteriorates due to moisture (water) and has a disadvantage of being hard to obtain long-term reliability. The light emitting element which is deteriorated due to water causes a decrease in luminance or does not emit light. It is conceivable that this causes a dark spot (black spot) and shrinkage (a decrease in luminance from an edge portion of a display device) in a display device using the light emitting element. Various countermeasures are suggested to suppress such deterioration (for example, Reference 1: Japanese Patent Laid-Open No. H9-148066, and Reference 2: Japanese Patent Laid-Open No. H7-169567).

However, these countermeasures are insufficient and have few effects on a defect that a region where emission intensity is decreased is gradually increased with time. A major reason for such a defect is an influence of water remaining inside a light emitting device besides water entering from outside. Additional countermeasures are desired.

SUMMARY OF THE INVENTION

It is an object of the present invention to provide a structure and a manufacturing method of a light emitting device, which reduces the amount of water remaining in the light emitting device.

It is another object of the invention to provide a structure and a manufacturing method of a light emitting device, which suppresses the deterioration of a light emitting element due to water remaining in the light emitting device.

A light emitting device of the invention includes a thin film transistor, an insulating layer covering the thin film transistor, an electrode which is electrically connected to the thin film transistor through a contact hole formed on the insulating layer, and a light emitting element formed by interposing a light emitting layer between a first electrode which is electrically connected to the electrode and a second electrode. The light emitting device further includes a layer formed of a different material from that of the insulating layer only between the electrode and the first electrode and the insulating layer.

Another light emitting device of the invention includes a thin film transistor, an insulating layer covering the thin film transistor, an electrode which is electrically connected to the thin film transistor through a contact hole formed on the insulating layer, and a light emitting element formed by interposing a light emitting layer between a first electrode which is electrically connected to the electrode and a second electrode. The light emitting device further includes a layer formed of a different material from that of the insulating layer only between the electrode and the insulating layer.

Another light emitting device of the invention includes a thin film transistor, a first insulating layer covering the thin film transistor, and an electrode which is formed over the first insulating layer and is electrically connected to the thin film transistor through a contact hole formed on the first insulating layer. A wiring and a first electrode of a light emitting element are formed over a second insulating layer which is formed to cover the first insulating layer and the electrode. The first electrode of a light emitting element is electrically connected to the electrode through a contact hole formed on the second insulating layer. The light emitting element is formed by interposing a light emitting layer between the first electrode and a second electrode. The light emitting device further includes a film formed of a different material from the second insulating layer only between a top surface of the second insulating layer and the first electrode of a light emitting element and the wiring.

Another light emitting device of the invention includes a thin film transistor, a first insulating layer covering the thin film transistor, and an electrode which is formed over the first insulating layer and is electrically connected to the thin film transistor through a contact hole formed on the first insulating layer. A wiring and a first electrode of a light emitting element are formed over a second insulating layer which is formed to cover the first insulating layer and the electrode. The first electrode of a light emitting element is electrically connected to the wiring through a contact hole formed on the second insulating layer. The light emitting element is formed by interposing a light emitting layer between the first electrode and a second electrode. The light emitting device further includes a film formed of a different material from the second insulating layer only between a top surface of the second insulating layer and the wiring.

Another light emitting device of the invention includes a thin film transistor, a first insulating layer covering the thin film transistor, and an electrode which is formed over the first insulating layer and is electrically connected to the thin film transistor through a contact hole formed on the first insulating layer. A wiring and a first electrode of a light emitting element are formed over a second insulating layer which is formed to cover the first insulating layer and the electrode. The first electrode of a light emitting element is electrically connected to the wiring through a contact hole formed on the second insulating layer. The light emitting element is formed by interposing a light emitting layer between the first electrode and a second electrode. The light emitting device further includes a film formed of a different material from the second insulating layer only between a top surface of the first insulating layer and the electrode.

Another light emitting device of the invention includes a thin film transistor, a first insulating layer covering the thin film transistor, and an electrode which is formed over the first insulating layer and is electrically connected to the thin film transistor through a contact hole formed on the first insulating layer. A wiring and a first electrode of a light emitting element are formed over a second insulating layer which is formed to cover the first insulating layer and the electrode. The first electrode of a light emitting element is electrically connected to the wiring through a contact hole formed on the second insulating layer. The light emitting element is formed by interposing a light emitting layer between the first electrode and a second electrode. The light emitting device further includes a first film formed of a different material from the first insulating layer only between a top surface of the first insulating layer and the electrode, and a second film formed of a different material from the second insulating layer only between a top surface of the second insulating layer and the wiring and the first electrode of a light emitting element.

Another light emitting device of the invention includes a thin film transistor, a first insulating layer covering the thin film transistor, and an electrode which is formed over the first insulating layer and is electrically connected to the thin film transistor through a contact hole formed on the first insulating layer. A wiring and a first electrode of a light emitting element are formed over a second insulating layer which is formed to cover the first insulating layer and the electrode. The first electrode of a light emitting element is electrically connected to the wiring through a contact hole formed on the second insulating layer. The light emitting element is formed by interposing a light emitting layer between the first electrode and a second electrode. The light emitting device further includes a first film formed of a different material from the first insulating layer only between a top surface of the first insulating layer and the electrode, and a second film formed of a different material from the second insulating layer only between a top surface of the second insulating layer and the wiring.

According to a method for manufacturing a light emitting device of the invention, a thin film transistor is formed over an insulating surface, and an insulating layer is formed over the thin film transistor. An etching stopper film is formed of a different material from the insulating layer over the insulating layer, and an electrode which penetrates the etching stopper film and the insulating layer and is electrically connected to the thin film transistor is formed. Subsequently, a first electrode of a light emitting element, which is electrically in contact with a part of the electrode, is formed, and the etching stopper film is removed by using the electrode and the first electrode of a light emitting element as a mask.

According to another method for manufacturing a light emitting device of the invention, a thin film transistor is formed over an insulating surface, and an insulating layer is formed over the thin film transistor. An etching stopper film is formed of a different material from the insulating layer over the insulating layer, and an electrode which penetrates the etching stopper film and the insulating layer and is electrically connected to the thin film transistor is formed. Subsequently, the etching stopper film is removed by using the electrode as a mask, and a first electrode of a light emitting element, which is electrically in contact with a part of the electrode, is formed.

According to another method for manufacturing a light emitting device of the invention, a thin film transistor is formed over an insulating surface formed over a substrate, and an insulating layer is formed over the thin film transistor. An etching stopper film is formed of a different material from the insulating layer over the insulating layer, and an electrode which penetrates the etching stopper film and the insulating layer and is electrically connected to the thin film transistor is formed. Subsequently, a first electrode of a light emitting element, which is electrically in contact with a part of the electrode, is formed, the etching stopper film is removed by using the electrode and the first electrode of a light emitting element as a mask, and the substrate is heat-treated.

According to another method for manufacturing a light emitting device of the invention, a thin film transistor is formed over an insulating surface formed over a substrate, and an insulating layer is formed over the thin film transistor. An etching stopper film is formed of a different material from the insulating layer over the insulating layer, and an electrode which penetrates the etching stopper film and the insulating layer and is electrically connected to the thin film transistor is formed. Subsequently, the etching stopper film is removed by using the electrode as a mask, a first electrode of a light emitting element, which is electrically in contact with a part of the electrode, is formed, and the substrate is heat-treated.

According to another method for manufacturing a light emitting device of the invention, a thin film transistor is formed over an insulating surface formed over a substrate, and an insulating layer is formed over the thin film transistor. An etching stopper film is formed of a different material from the insulating layer over the insulating layer, and an electrode which penetrates the etching stopper film and the insulating layer and is electrically connected to the thin film transistor is formed. Subsequently, a first electrode of a light emitting element, which is electrically in contact with a part of the electrode, is formed, the etching stopper film is removed by using the electrode and the first electrode of a light emitting element as a mask, and the substrate is heat-treated in a vacuum.

According to another method for manufacturing a light emitting device of the invention, a thin film transistor is formed over an insulating surface formed over a substrate, and an insulating layer is formed over the thin film transistor. An etching stopper film is formed of a different material from the insulating layer over the insulating layer, and an electrode which penetrates the etching stopper film and the insulating layer and is electrically connected to the thin film transistor is formed. Subsequently, the etching stopper film is removed by using the electrode as a mask, a first electrode of a light emitting element, which is electrically in contact with a part of the electrode, is formed, and the substrate is heat-treated in a vacuum.

According to another method for manufacturing a light emitting device of the invention, a thin film transistor is formed over an insulating surface formed over a substrate, and an insulating layer is formed over the thin film transistor. An etching stopper film is formed of a different material from the insulating layer over the insulating layer, and an electrode which penetrates the etching stopper film and the insulating layer and is electrically connected to the thin film transistor is formed. Subsequently, a first electrode of a light emitting element, which is electrically in contact with a part of the electrode, is formed, and the etching stopper film is removed by using the electrode and the first electrode of a light emitting element as a mask. Then, a bank is formed to cover an edge portion of the first electrode of a light emitting element, the substrate is heat-treated in a vacuum, a light emitting film is continuously formed over the bank to the first electrode, and a second electrode is formed to cover the bank and the light emitting film.

According to another method for manufacturing a light emitting device of the invention, a thin film transistor is formed over an insulating surface formed over a substrate, and an insulating layer is formed over the thin film transistor. An etching stopper film is formed of a different material from the insulating layer over the insulating layer, and an electrode which penetrates the etching stopper film and the insulating layer and is electrically connected to the thin film transistor is formed. Subsequently, the etching stopper film is removed by using the electrode as a mask, and a first electrode of a light emitting element, which is electrically in contact with a part of the electrode, is formed. Then, a bank is formed to cover an edge portion of the first electrode of a light emitting element, the substrate is heat-treated in a vacuum, a light emitting film is continuously formed over the bank to the first electrode of a light emitting element, and a second electrode is formed to cover the bank and the light emitting film.

In a light emitting device having a structure of the invention, the amount of water remaining inside the light emitting device is reduced. Further, the deterioration of a light emitting element due to water remaining inside can be suppressed.

In a light emitting device manufactured by a method for manufacturing a light emitting element of the present invention, the amount of water remaining inside the light emitting device is reduced. Further, the deterioration of a light emitting element due to water remaining inside can be suppressed.

BRIEF DESCRIPTION OF DRAWINGS

FIGS. 7A to 7E show examples of an electronic device of the invention.

DETAILED DESCRIPTION OF THE INVENTION

Figure 1A:
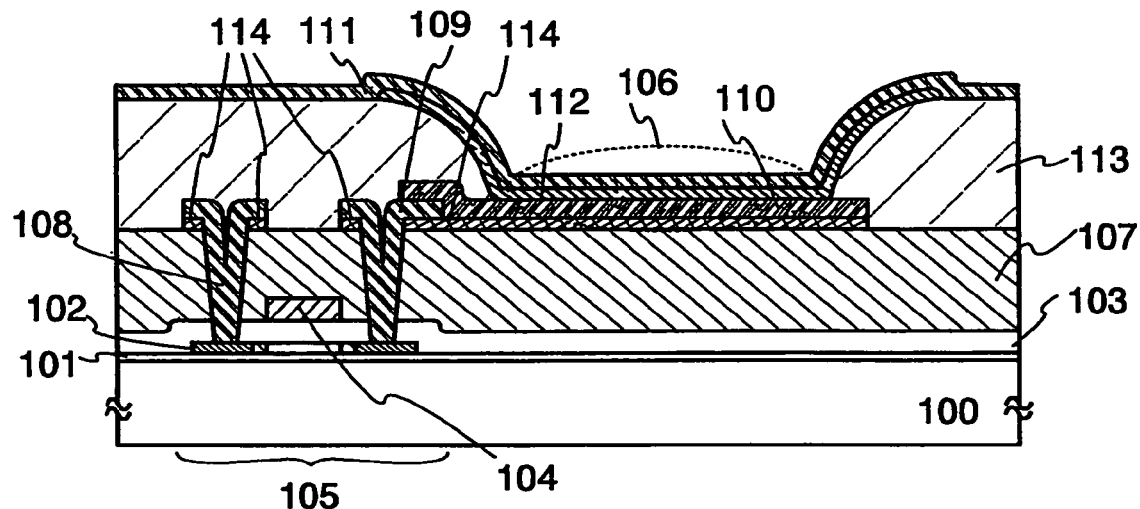
FIGS. 1A and 1B are cross-sectional views showing a light emitting device of the invention.

Hereinafter, a preferred embodiment mode of the present invention will be described with reference to the attached drawings. The invention is not limited to the following description. As is easily known to a person skilled in the art, the mode and the detail of the invention can be variously changed without departing from the purpose and the scope of the invention. Thus, the invention is not interpreted while limiting to the following description of the embodiment mode. Note that a reference numeral may not be given to a portion having similar function and shape, and the description thereof may be omitted.

Embodiment Mode 1

Figure 1B:
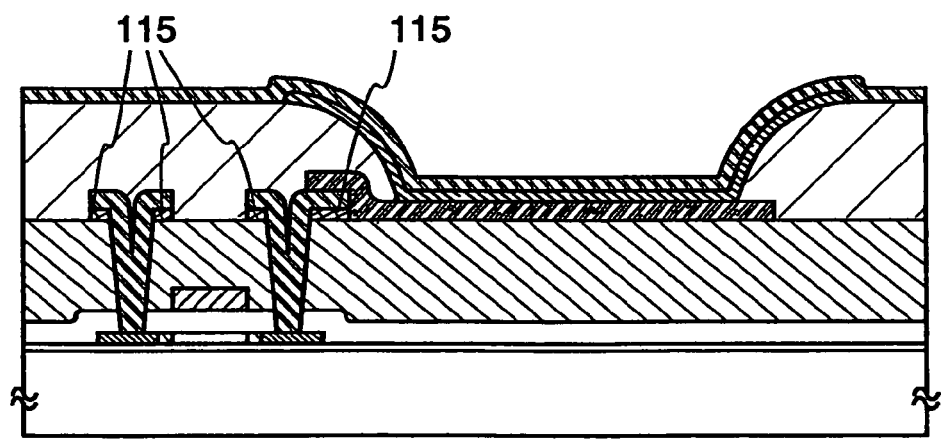

FIGS. 1A and 1B are cross-sectional views showing part of a light emitting device of the invention. A light emitting device of the invention includes: a base insulating layer 101 formed over a substrate 100; a thin film transistor 105 having a semiconductor layer 102 formed over the base insulating layer 101 as an active layer, a gate insulating layer 103, and a gate electrode 104; and a light emitting element 106. The thin film transistor 105 is covered with an insulating layer 107. Over the insulating layer 107, electrodes 108 and 109 of the thin film transistor 105 which electrically connect to the semiconductor layer 102 through contact holes penetrating the insulating layer 107 and the gate insulating layer 103, and a wiring (not shown) are formed. Note that the wiring may be formed at the same time as the electrodes 108 and 109, but may be separately formed. A first electrode 110 of the light emitting element 106 is formed to partially overlap and electrically connect to the electrode 109 of the thin film transistor 105. An edge portion of the first electrode 110 is covered with a bank 113. The light emitting element 106 is formed by interposing a light emitting layer 112, which is continuously formed over the bank 113 to the first electrode 110, between the first electrode 110 and a second electrode 111. Light can be emitted from a portion of the light emitting layer 112, which is directly sandwiched between the first electrode 110 and the second electrode 111.

The insulating layer 107 is preferably formed of a material which has a self-planarizing property and can reduce irregularity caused by the thin film transistor 105 thereunder, in order to improve an aperture ratio. For example, a self-planarizing application film of acrylic, polyimide, siloxane (a material which is composed of a skeleton formed by the bond of silicon and oxygen and which includes either an organic group containing at least hydrogen (such as an alkyl group or aromatic hydrocarbon) or a fluoro group or both as a substituent), or the like is preferably used.

In FIG. 1A, an etching stopper film 114 remains only between the electrodes 108, 109, and 110 and the wiring, which are formed over the insulating layer 107, and the insulating layer 107. In other words, it remains only between the electrodes 108 and 109 of the thin film transistor 105, the first electrode 110 of the light emitting element 106, and the wiring (not shown) formed between the insulating layer 107 and the bank 113, and a top surface of the insulating layer 107. When the electrodes 108, 109, and 110 and the wiring formed between the insulating layer 107 and the bank 113 are formed by etching, the etching stopper film 114 has a function of preventing the insulating layer 107 from being etched. In the case of the light emitting device of the invention in this embodiment mode, the etching stopper film 114 is formed to cover the insulating layer 107; a contact hole is formed; the electrodes 108, 109, and 110 and the wiring formed between the insulating layer 107 and the bank 113 are formed thereover, and then, an exposed portion of the etching stopper film is removed. Thus, the light emitting device of the invention can be formed to have such a structure that the etching stopper film 114 remains only below the electrodes 108 and 109, the wiring formed between the insulating layer 107 and the bank 113, and the first electrode 110 of the light emitting element 106.

The etching stopper film 114 is formed of a water impermeable material which is different from the insulating layer 107, with or without conductivity. A film which mainly contains silicon nitride is preferably used as the etching stopper film. A material, having a sufficiently lower etching rate than those of the electrodes 108 and 109 at the time of etching to form the electrodes 108 and 109, is used.

In the light emitting device of the invention having the structure, the etching stopper film 114 is not entirely formed over the insulating layer 107 at the time of performing heat treatment for removing water in the insulating layer 107. Therefore, water is effectively removed from a portion where the etching stopper film 114 is removed, and the amount of water remaining in the insulating layer 107 can be reduced.

Since the etching stopper film 114 is not entirely formed over the insulating layer 107, even when a small amount of water remaining in the insulating layer 107 seeps into the layer where the light emitting element 106 is formed, the water is not locally concentrated. Thus, an influence of water seeping from the insulating layer 107 on the light emitting element 106 can be reduced. If the etching stopper film is entirely formed over the insulating layer 107, the water remaining in the insulating layer 107 seeps, in a concentrated manner, from a tiny pinhole in the etching stopper film or at the boundary with the electrodes 108 and 109. Therefore, deterioration of the light emitting element located in the periphery thereof is promoted.

Since the deterioration of the light emitting element 106 due to water can be suppressed, improvement in display quality and reliability can be realized.

FIG. 1B is different from FIG. 1A in the way that there is an etching stopper film 115 only below electrodes 108 and 109 of a thin film transistor 105 and a wiring (not shown) formed between an insulating layer 107 and a bank 113, but not below a first electrode 110 of a light emitting element 106. Only the timing of removing the etching stopper film 115 is different, but an effect and a structure of the etching stopper film are similar to that in FIG. 1A. In other words, the steps are as follows: the insulating layer 107 and the etching stopper film 115 are formed; the electrodes 108 and 109 of the thin film transistor and the wiring are formed; and an exposed portion of the etching stopper film 115 is removed before forming the first electrode 110 of the light emitting element 106.

Figure 11A:
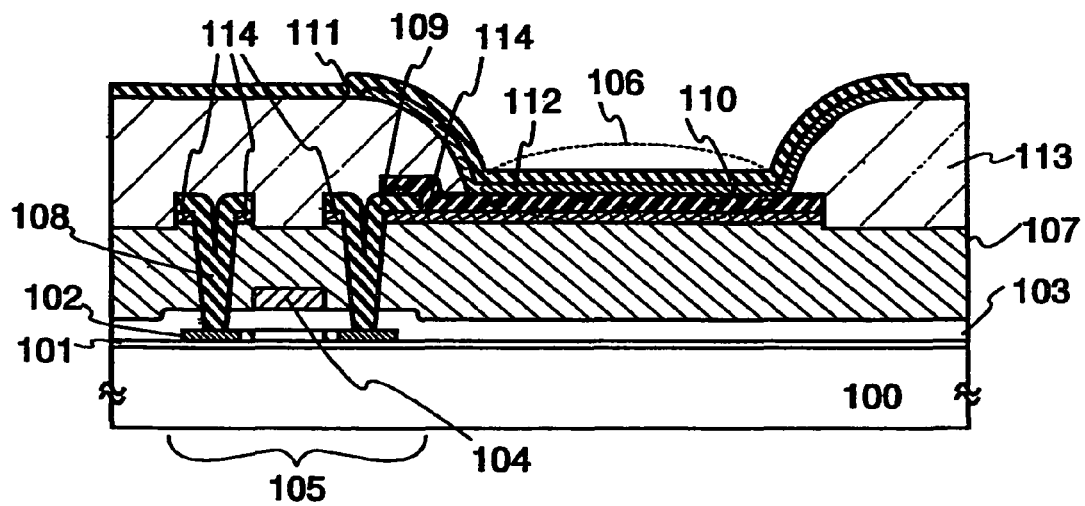
FIGS. 11A and 11B are cross-sectional views showing a light emitting device of the invention.
Figure 11B:
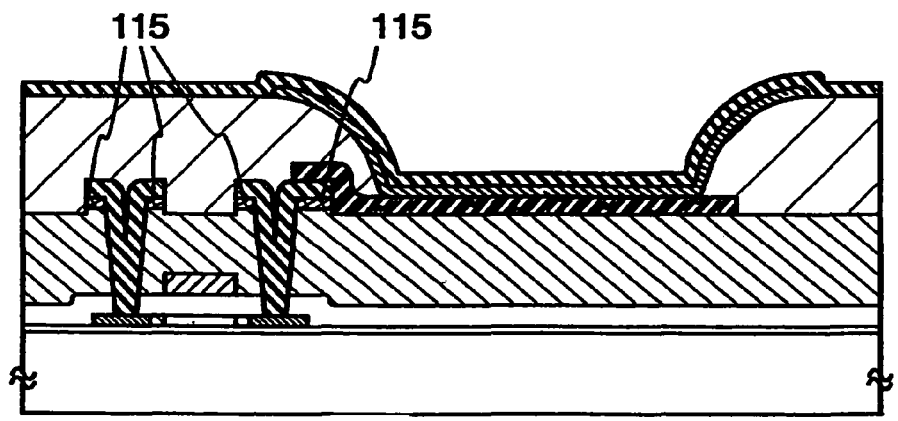

In order to completely remove a portion of the etching stopper film 115 which is to be removed, it is effective to perform overetching to some extent. In this case, the insulating layer may be etched in some cases, depending on an etching rate of the insulating layer under removing conditions of the etching stopper film. For example, schematic diagrams of the structures corresponding to FIGS. 1A and 1B in the case of performing overetching are shown in FIGS. 11A and 11B, respectively. As shown, a portion of the insulating layer 107 where the etching stopper film 115 remains is thicker than a portion of the insulating layer 107 where the etching stopper film 115 is removed.

Note that overetching can be applied to other structures of the invention. In that case, a portion of the insulating layer where the etching stopper remains is thicker than a portion of the insulating layer where the etching stopper film is removed.

Figure 2A:
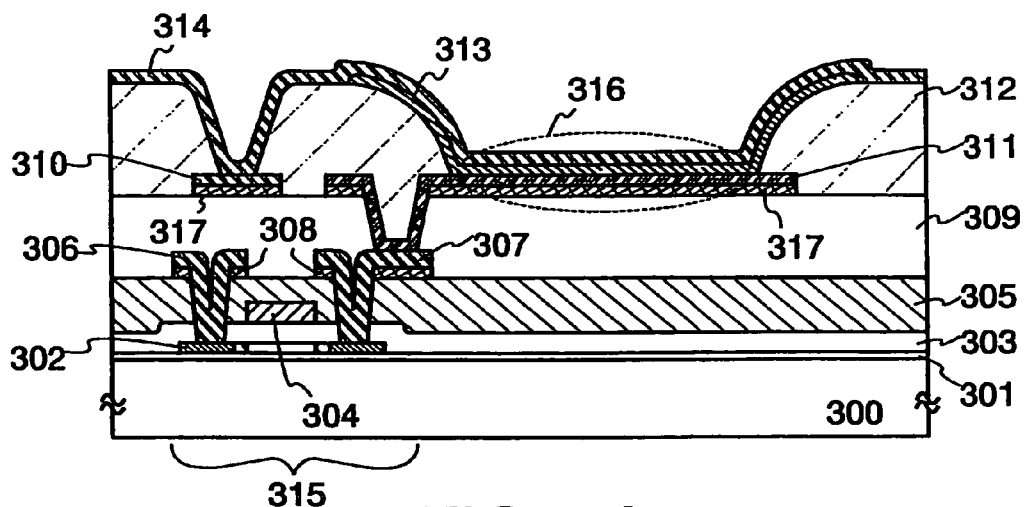
FIGS. 2A to 2C are cross-sectional views showing a light emitting device of the invention.

FIG. 2A is a cross-sectional view of a light emitting device of the invention, in which an electrode of a thin film transistor is formed in a different layer from a first electrode of a light emitting element. The light emitting device of the invention includes: a base insulating layer 301 formed over a substrate 300; a thin film transistor 315 having a semiconductor layer 302 formed over the base insulating layer 301 as an active layer, a gate insulating layer 303, and a gate electrode 304; and a light emitting element 316. The thin film transistor 315 is covered with a first insulating layer 305. Over the first insulating layer 305, a wiring (not shown) and electrodes 306 and 307 of the thin film transistor 315 which electrically connect to the semiconductor layer 302 through contact holes penetrating the first insulating layer 305 and the gate insulating layer 303 are formed. Note that the wiring may be formed at the same time as the electrodes 306 and 307, or may be separately formed. The wiring (not shown), the electrodes 306 and 307 of the thin film transistor 315, and the first insulating layer 305 are covered with a second insulating layer 309. Over the second insulating layer 309, a first electrode 311 of the light emitting element 316, which electrically connects to the electrode 307 of the thin film transistor 315 through a contact hole penetrating the second insulating layer 309, is formed. The light emitting element 316 is formed by interposing a light emitting layer 313 between the first electrode 311 and a second electrode 314 which are formed over the second insulating layer 309. A wiring 310 may be formed over the second insulating layer 309. When the second electrode 314 has high resistance, the wiring 310 can be used as an auxiliary wiring by forming a contact hole reaching the wiring 310 in a bank 312 and connecting the second electrode 314 to the wiring 310. Naturally, the wiring 310 may be used for other applications as well as an auxiliary wiring.

In FIG. 2A, either the first insulating layer 305 or the second insulating layer 309 is formed of a material which has a self-planarizing property and can reduce irregularity caused by the thin film transistor 315 thereunder or the like, in order to improve an aperture ratio. For example, a self-planarizing application film of acrylic, polyimide, siloxane, or the like is used.

An etching stopper film 308 is formed between a top surface of the first insulating layer 305 and the electrodes 306 and 307 of the thin film transistor 315 and the wiring (not shown) formed between the first insulating layer 305 and the bank 312. When the electrodes 306 and 307 and the wiring formed between the first insulating layer 305 and the bank 312 are formed by etching, the etching stopper film 308 has a function of preventing the first insulating layer 305 from being etched. In the case of the light emitting device of the invention in this embodiment mode, the etching stopper film is formed to cover the first insulating layer 305; a conductive film is formed thereover, patterned, and etched to form the electrodes 306 and 307 and the wiring; and an exposed portion of the etching stopper film is removed. Thus, the light emitting device of the invention can be formed to have such a structure that the etching stopper film 308 remains only below the electrodes 306 and 307 and the wiring formed between the first insulating layer 305 and the bank 312.

The etching stopper film 308 is formed of a water impermeable material which is different from the first insulating layer 305, with or without conductivity. A film which mainly contains silicon nitride is preferably used as the etching stopper film. A material, having a sufficiently lower etching rate than those of the electrodes 306 and 307 and the wiring formed between the first insulating layer 305 and the bank 312 at the time of etching to form the electrodes 306 and 307 and the wiring, is used.

An etching stopper film 317 is also formed between a top surface of the second insulating layer 309 and the first electrode 311 of the light emitting element 316 and the wiring 310. When the first electrode 311 and the wiring 310 are formed by etching, the etching stopper film 317 has a function of preventing the second insulating layer 309 from being etched. The etching stopper film 317 is formed as in the case with the etching stopper film 308: an etching stopper film is formed to cover the second insulating layer 309, the first electrode 311 and the wiring 310 are formed thereover, and an exposed portion of the etching stopper film is removed. Thus, the light emitting device of the invention can be formed to have such a structure that the etching stopper film 317 remains only below the first electrode 311 and the wiring 310.

The etching stopper film 317 is formed of a material different from the second insulating layer 309, with or without conductivity. A film which mainly contains silicon nitride is preferably used as the etching stopper film. A material, having a sufficiently lower etching rate than those of the first electrode 311 and the wiring 310 at the time of etching to form the first electrode 311 and the wiring 310, is used.

When either the etching stopper film 308 or the etching stopper film 317 is not required in terms of the etching rate, the etching stopper film may not be formed.

In the light emitting device of the invention having the structure, the etching stopper films are not entirely formed over the first insulating layer 305 and the second insulating layer 309 at the time of performing heat treatment for removing water in the insulating layers. Therefore, water is effectively removed from a portion where the etching stopper films are removed, and the amount of water remaining in the first insulating layer 305 and the second insulating layer 309 can be reduced.

Since the etching stopper film 317 is not entirely formed over the insulating layer, even when a small amount of water remaining in the insulating layer seeps into the layer where the light emitting element 316 is formed, the water is not locally concentrated. Thus, an influence of water seeping from the second insulating layer 309 on the light emitting element 316 can be reduced.

Since the deterioration of the light emitting element 316 due to water can be suppressed, improvement in display quality and reliability can be realized.

Figure 2B:
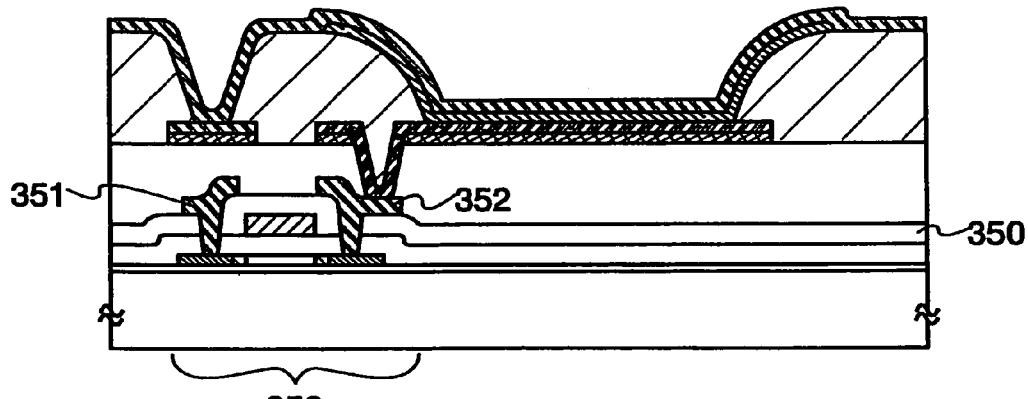

FIG. 2B has a structure almost similar to FIG. 2A, but it shows an example that a first insulating layer 350 is formed of an inorganic film of silicon oxide, silicon nitride, or the like. Since such a film often has a sufficient difference in an etching rate with electrodes 351 and 352 of a thin film transistor 353 and a wiring, an etching stopper film between the electrodes 351 and 352 and the wiring formed between a first insulating layer 350 and a second insulating layer 309 and a top surface of the first insulating layer 350 may not be formed. In that case, the first insulating layer 350 directly reflects irregularity thereunder, therefore, the second insulating layer 309 is formed of a self-planarizing material. For example, a self-planarizing application film of acrylic, polyimide, siloxane, or the like corresponds to this. Note that other structures and effects are similar to those in FIG. 2A, so description is omitted.

Figure 2C:
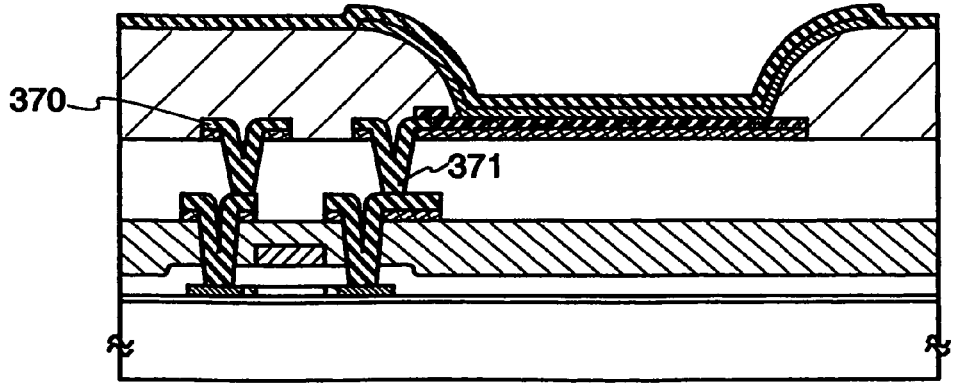

FIG. 2C has a structure almost similar to FIG. 2A, but the wiring 310 in FIG. 2A is used not as an auxiliary wiring for reducing apparent resistance of a second electrode of a light emitting element but as a wiring 370 electrically connecting to the electrode 306 of the thin film transistor 315. The first electrode 311 of the light emitting element is connected to the electrode 307 of the thin film transistor 315 not directly but through a wiring 371. Note that other structures and effects are similar to those in FIG. 2A, so description is omitted.

In this embodiment mode, the structure that an etching stopper is formed between an electrode of a transistor and an insulating layer thereunder, the structure that an etching stopper is formed between a wiring and an insulating layer thereunder, the structure that an etching stopper film is formed between an electrode of a light emitting element and an insulating layer thereunder, and the structure that an etching stopper is not formed between an electrode of a light emitting element and an insulating layer thereunder are disclosed, and patterns that each of the structures is applied to the structure that an electrode of a transistor and an electrode of a light emitting element are formed in the same layer, the structure that they are formed in different layers, and the like are described. However, the elements can be freely combined with each other.

In this embodiment mode, the base insulating layer, the insulating layer, the first insulating layer, and the second insulating layer are described as single layers; however, they may have multilayer structures of two or more layers. In addition, the etching stopper film may also be a single layer or have a multilayer structure.

Embodiment Mode 2

A method for manufacturing a light emitting element of the invention is described in this embodiment mode with reference to FIGS. 3A to 3D and FIGS. 4A to 4D.

Figure 3A:
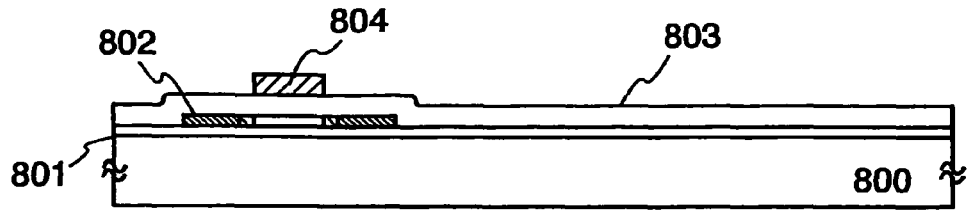
FIGS. 3A to 3D are cross-sectional views showing a method for manufacturing a light emitting device of the invention.

An insulating layer 801 is formed over a substrate 800, and a semiconductor layer is then formed over the insulating layer 801 (FIG. 3A).

Light transmitting glass, quartz, plastic (such as polyimide, acrylic, polyethylene terephthalate, polycarbonate, polyacrylate, or polyethersulfone), or the like can be used as a material of the substrate 800. The substrate thereof may be used after being polished by CMP or the like, if necessary. In this embodiment mode, a glass substrate is used.

The insulating layer 801 is formed in order to prevent an element exerting an adverse influence on characteristics of the semiconductor layer, such as an alkali metal or an alkaline earth metal contained in the substrate 800, from diffusing into the semiconductor layer. Silicon oxide, silicon nitride, silicon oxide containing nitrogen, silicon nitride containing oxygen, or the like can be used as a material thereof, and the insulating layer is formed to be a single layer or to have a laminated structure. Note that the insulating layer 801 is not necessarily required to be formed when diffusion of an alkali metal or an alkaline earth metal need not be worried about.

The subsequently formed semiconductor layer is obtained by performing laser crystallization on an amorphous silicon film in this embodiment mode. An amorphous silicon film is formed to be 25 nm to 100 nm (preferably, 30 nm to 60 nm) in thickness over the insulating layer 801. A known method such as a sputtering method, a low pressure CVD method, or a plasma CVD method can be used as a manufacturing method thereof. Subsequently, the amorphous silicon film is heat-treated at a temperature of 500° C. for one hour for dehydrogenation.

Then, the amorphous silicon film is crystallized with the use of a laser irradiation apparatus to form a crystalline silicon film. As to the laser crystallization in this embodiment mode, an excimer laser is used, and an emitted laser beam is processed to have a linear beam spot with an optical system. The amorphous silicon film is irradiated therewith to be a crystalline silicon film, and is used as the semiconductor layer.

As another method for crystallizing an amorphous silicon film, there is a crystallizing method only by heat treatment, a crystallizing method by heat treatment with the use of a catalytic element which promotes crystallization, or the like. Nickel, iron, palladium, tin, lead, cobalt, platinum, copper, gold, or the like can be used as the element which promotes crystallization. By using the element, crystallization can be performed at a lower temperature in a shorter time, compared to the case of performing crystallization only by heat treatment. Therefore, a glass substrate or the like is less damaged. In the case of performing crystallization only by heat treatment, a highly heat resistant quartz substrate or the like needs to be used as the substrate 800.

Subsequently, addition of a very small amount of impurities, so-called channel doping, is performed on the semiconductor layer to control a threshold value, if necessary. An N type or P type impurity (phosphorus, boron, or the like) is added by an ion doping method to obtain a required threshold value.

Thereafter, the semiconductor layer is patterned to have a predetermined shape as shown in FIG. 3A, thereby obtaining an island-shaped semiconductor layer 802. A photoresist is applied to the semiconductor layer, exposed to light, and baked to form a resist mask having a predetermined shape over the semiconductor layer. Etching is performed using the mask. Thus, the patterning is performed.

A gate insulating layer 803 is formed to cover the semiconductor layer 802. The gate insulating layer 803 is formed of an insulating layer containing silicon by a plasma CVD method or a sputtering method to be 40 nm to 150 nm in thickness.

A gate electrode 804 is formed over the gate insulating layer 803. The gate electrode 804 may be formed by using an element of Ta, W, Ti, Mo, Al, Cu, Cr, or Nd, or by using an alloy material or compound material which mainly contains the element. A semiconductor film typified by a polycrystalline silicon film doped with an impurity element such as phosphorus may be used. Alternatively, an AgPdCu alloy may be used.

The gate electrode 804 is formed to be a single layer in this embodiment mode; however, it may be formed to have a laminated structure of two or more layers (for example, a laminated structure of a tungsten layer as a lower layer and a molybdenum layer as an upper layer). The above-mentioned material may be used, even in the case of forming a gate electrode having a laminated structure. A combination thereof may also be appropriately selected.

The gate electrode 804 is processed by etching using a mask of a photoresist.

The semiconductor layer 802 is added with a highly concentrated impurity with the use of the gate electrode 804 as a mask. According to this step, a thin film transistor including the semiconductor layer 802, the gate insulating layer 803, and the gate electrode 804 is formed.

A manufacturing step of a thin film transistor is not particularly limited, and it may be appropriately changed so that a transistor having a desired structure can be formed.

A top gate thin film transistor using a crystalline silicon film which is crystallized by employing laser crystallization is used in this embodiment mode; however, a bottom gate thin film transistor using an amorphous semiconductor film can be used for a pixel portion. Silicon germanium as well as silicon can be used for an amorphous semiconductor. In the case of using silicon germanium, the concentration of germanium is preferably approximately 0.01 atomic % to 45 atomic %.

A microcrystalline semiconductor (semi-amorphous semiconductor) film, in which a crystal grain of 0.5 nm to 20 nm can be observed within an amorphous semiconductor, may be used. A microcrystalline state in which a crystal grain of 0.5 nm to 20 nm can be observed is also referred to as a microcrystal (μc).

Semi-amorphous silicon (also referred to as SAS) that is a semi-amorphous semiconductor can be obtained by performing glow discharge decomposition on a silicide gas. $SiH_4$ is used as a typical silicide gas. In addition, $Si_2H_6$, $SiH_2Cl_2$, $SiHCl_3$, $SiCl_4$, $SiF_4$, or the like can also be used as the silicide gas. The silicide gas may be diluted with hydrogen, or hydrogen and one or more rare gas elements of helium, argon, krypton, and neon, thereby making formation of the SAS easy. At this time, it is preferable to dilute the silicide gas so that a dilution ratio ranges from 10 times to 1000 times. Reaction production of a film by glow discharge decomposition may be performed with pressures in the range of 0.1 Pa to 133 Pa High-frequency powers of 1 MHz to 120 MHz, preferably, 13 MHz to 60 MHz may be supplied to form a glow discharge. A substrate heating temperature is preferably 300° C. or less, and a recommended substrate heating temperature is in the range of 100° C. to 250° C.

In the thus formed SAS, a Raman spectrum is shifted to a lower frequency side than 520 $cm^{-1}$. A diffraction peak of (111) or (220) to be caused by a crystal lattice of silicon is observed in X-ray diffraction. The SAS contains hydrogen or halogen of at least 1 atomic % or more to terminate a dangling bond. It is desirable that an atmospheric constituent impurity such as oxygen, nitrogen, or carbon is $1 \times 10^{20}/cm^3$ or less as an impurity element in the film; specifically, an oxygen concentration is $5 \times 10^{19}/cm^3$ or less, preferably $1 \times 10^{19}/cm^3$ or less. When the SAS is processed into a TFT, mobility thereof is as follows: $\mu = 1 \, cm^2/Vsec$ to $10 \, cm^2/Vsec$. The SAS may be further crystallized with a laser.

Figure 3B:
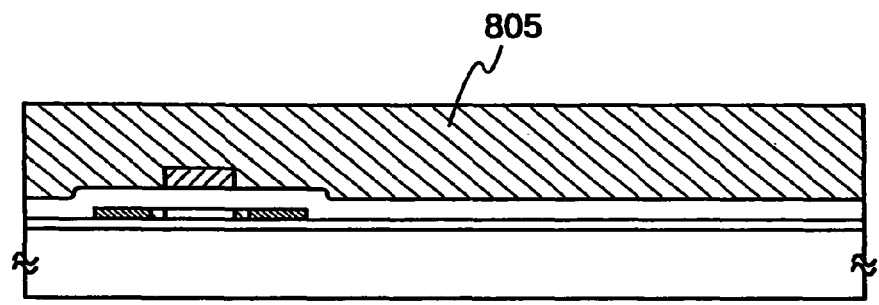

Subsequently, an insulating layer 805 is formed to cover the gate electrode 804 and the gate insulating layer 803. The insulating layer 805 may be formed of acrylic, polyimide, or siloxane. In this embodiment mode, the insulating layer 805 is formed of siloxane (FIG. 3B).

Figure 3C:
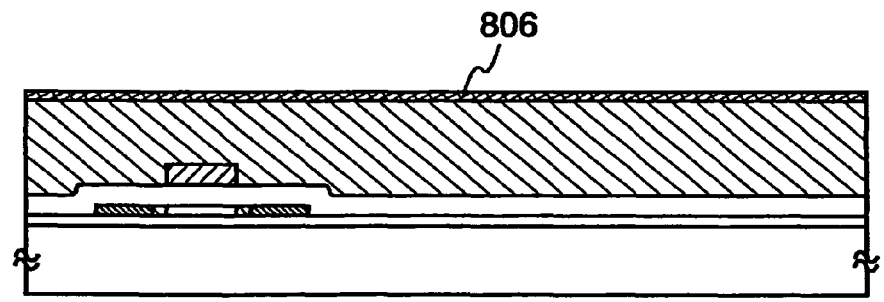

An etching stopper film 806 is formed over the insulating layer 805. The etching stopper film 806 is formed of a material different from the insulating layer 805. Specifically, the etching stopper film is formed of a material having sufficient selectivity to the insulating layer 805 so as not to etch the insulating layer 805, such as silicon nitride or silicon nitride containing oxygen, when subsequently formed electrodes 807 and 808 are formed by etching. Note that conductivity of a material of the etching stopper film is not necessarily required. In this embodiment mode, a silicon nitride film is formed as the etching stopper film 806 (FIG. 3C).

Figure 3D:
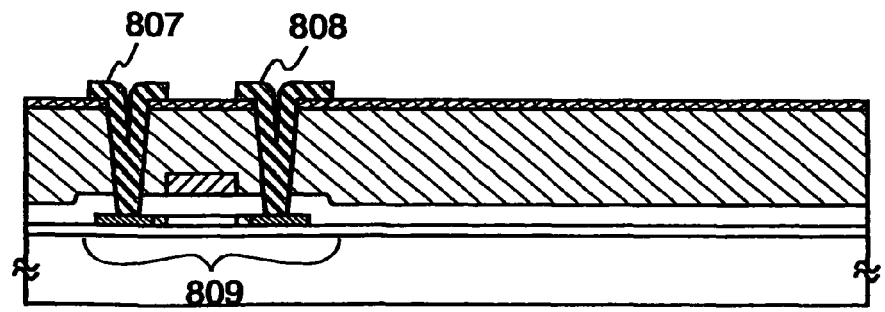

A contact hole penetrating the etching stopper film 806, the insulating layer 805, and the gate insulating layer 803 is formed to reach the semiconductor layer 802 (FIG. 3D).

The contact hole may be formed and the insulating layer on the periphery of the substrate may be removed using a resist by dry etching or wet etching. However, in some cases, the contact hole is preferably formed by etching plural times/multiple etching under different conditions, depending on a material of the insulating layer 805, the etching stopper film 806, and the gate insulating layer 803.

When wet etching is employed or the resist is removed by using a separating solution, it is conceivable that water enters the insulating layer 805. Therefore, heat treatment may be performed in order to remove water in the insulating layer 805 after removing the resist. Heat treatment can be performed in any condition of atmospheric air, reduced pressure, a vacuum, and a specific gas atmosphere. The treatment may be performed in a favorable condition. However, water cannot be sufficiently removed at this time in some cases, since the insulating layer 805 is covered with the etching stopper film 806.

A conductive layer is formed to cover the contact hole, the insulating layer 805, and the etching stopper film 806. The conductive layer is processed to have a desired shape, thereby forming the electrodes 807 and 808 and a wiring (not shown). They may be single layers of aluminum, copper, or the like; however, they are formed to have a laminated structure of molybdenum, aluminum, and molybdenum from a TFT side in this embodiment mode. The conductive layer may also have another laminated structure of titanium, aluminum, and titanium, or titanium, titanium nitride, aluminum, and titanium from a TFT side.

The conductive layer may be processed using a resist by dry etching or wet etching. The etching stopper film 806 can prevent the insulating layer 805 from being etched. As in the case of forming the contact hole, when wet etching is employed or the resist is removed by using a separating solution, it is conceivable that water enters the insulating layer 805. Therefore, heat treatment may be performed to remove water in the insulating layer 805 after removing the resist. Heat treatment can be performed in any condition of atmospheric air, reduced pressure, a vacuum, and a specific gas atmosphere. The treatment may be performed in a favorable condition. However, water cannot be sufficiently removed at this time in some cases, since the insulating layer 805 is covered with the etching stopper film 806.

According to the steps, a thin film transistor 809 in a pixel portion is completed.

Figure 4A:
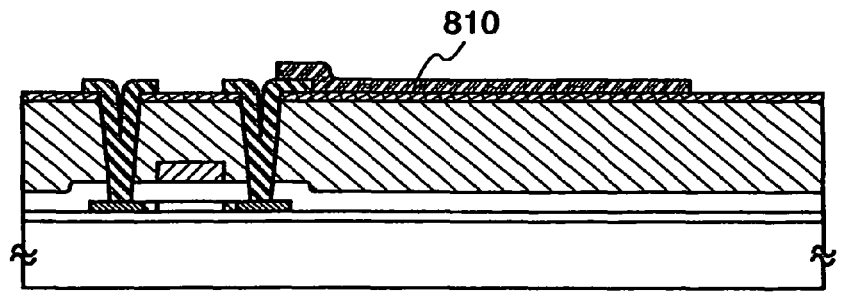
FIGS. 4A to 4D are cross-sectional views showing a method for manufacturing a light emitting device of the invention.

After a light transmitting conductive layer is formed to partially cover the electrode 808 of the thin film transistor 809 in the pixel portion, the light transmitting conductive layer is processed to form a first electrode 810 (FIG. 4A).

The light transmitting conductive layer may be processed using a resist by dry etching or wet etching. As in the case of forming the contact hole and the electrodes 807 and 808, when wet etching is employed or the resist is removed by using a separating solution, it is conceivable that water enters the insulating layer 805. Therefore, heat treatment may be performed to remove water in the insulating layer 805 after removing the resist. Heat treatment can be performed in any condition of atmospheric air, reduced pressure, a vacuum, and a specific gas atmosphere. The treatment may be performed in a favorable condition. However, water cannot be sufficiently removed at this time in some cases, since the insulating layer 805 is covered with the etching stopper film 806.

The first electrode 810 is electrically in contact with the electrode 808 of the thin film transistor 809. The first electrode 810 may be formed of ITO (indium tin oxide), ITO containing silicon oxide, IZO (Indium Zinc Oxide) in which indium oxide contains zinc oxide of 2% to 20%, zinc oxide, GZO (Gallium Zinc Oxide) in which zinc oxide contains gallium, or the like.

Figure 4B:
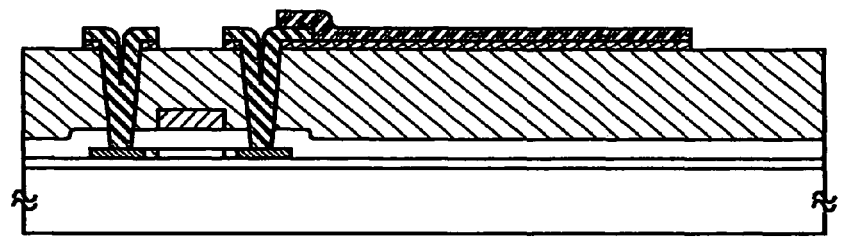

An exposed portion of the etching stopper film 806 is removed by etching using the electrodes 807 and 808 of the thin film transistor 809 and the first electrode 810 of a light emitting element as a mask. The etching may be performed by either wet etching or dry etching. In this embodiment mode, dry etching is employed (FIG. 4B)

Note that the first electrode 810 and the etching stopper film 806 may be simultaneously etched, when an etching method having high selectivity between the insulating layer 805 and the etching stopper film is employed. Another method for removing the etching stopper film 806 by controlling the etching time to etch the etching stopper film 806 at the same time as the etching of the electrodes 807 and 808 is conceivable.

When wet etching is employed, it is conceivable that water enters the insulating layer 805. Therefore, heat treatment may be performed to remove water in the insulating layer 805 after removing the resist. Since the insulating layer 805 is not covered with the etching stopper film 806, water can be sufficiently removed. In the case where there is a step of exposing to water again in the following steps, heat treatment may be performed at a time later after the step. Heat treatment can be performed in any condition of atmospheric air, reduced pressure, a vacuum, and a specific gas atmosphere. The treatment may be performed in a favorable condition.

Figure 4C:
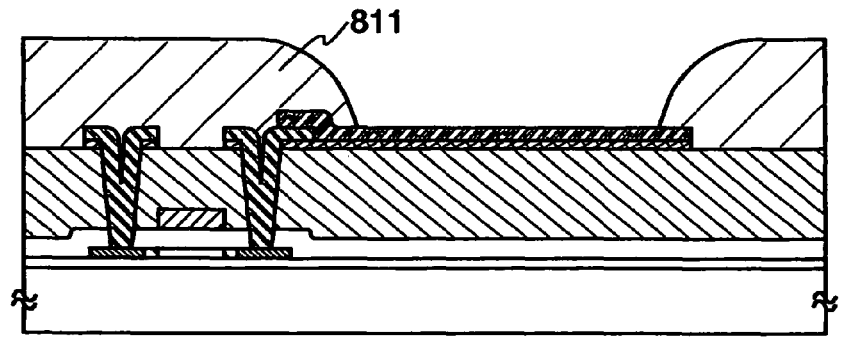

An insulating layer made of an organic material or an inorganic material is formed to cover the etching stopper film 806 and the first electrode 810. The insulating layer is processed to cover an edge portion of the first electrode and partially expose the first electrode, thereby forming a bank 811. The bank 811 is preferably formed of a photosensitive organic material (acrylic, polyimide, or the like), but may be formed of a non-photosensitive organic material or an inorganic material. In this embodiment mode, photosensitive polyimide is used. An end face of the bank 811, facing the first electrode, has curvature, and preferably has a tapered shape in which the curvature continuously changes. Note that the bank 811 may be mixed with a black material such as a pigment or carbon, and may be used as a black matrix (FIG. 4C).

The bank 811 may be processed by light-exposure and development when a photosensitive material is used, or by dry etching or wet etching using a resist when a non-photosensitive material is used. When development is performed using a photosensitive material, wet etching is employed, or the resist is removed by using a separating solution, it is conceivable that water enters the bank 811 and the insulating layer 805. Therefore, heat treatment may be performed to remove water in the bank 811 and the insulating layer 805 after removing the resist.

Heat treatment can be performed in any condition of atmospheric air, reduced pressure, a vacuum, and a specific gas atmosphere. The treatment may be performed in a favorable condition, but it is effective to perform heat treatment in a vacuum. Since the insulating layer 805 is not entirely covered with the etching stopper film 806, water can be sufficiently removed. In this embodiment mode, heat treatment is performed in a vacuum.

Figure 4D:
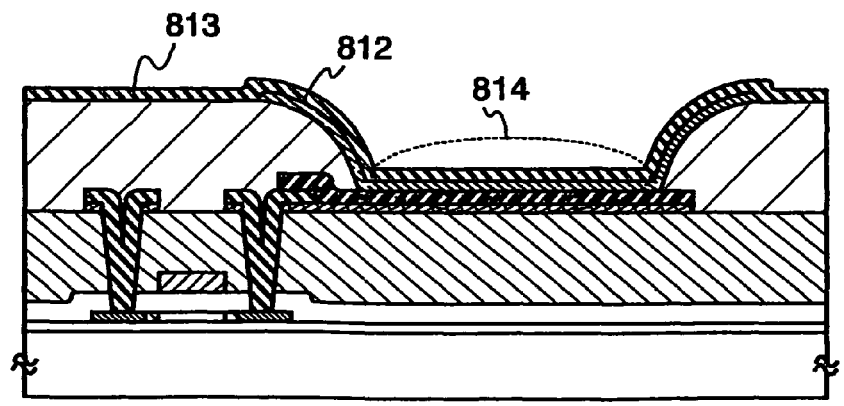

A light emitting layer 812 is formed to cover an exposed portion of the first electrode 810 which is not covered with the bank 811. The light emitting layer 812 may be formed by any of an evaporation method, an ink-jet method, a spin coating method, and the like (FIG. 4D).

A second electrode 813 is formed to cover the light emitting layer 812. Thus, a light emitting element 814 including the first electrode 810, the light emitting layer 812, and the second electrode 813 can be manufactured.

Note that it is preferable to form the light emitting layer 812 and the second electrode without exposing to atmospheric air after forming the bank 811 and heat treating in a vacuum. This is because atmospheric water can be prevented from being introduced into the light emitting device.

A silicon oxide film containing nitrogen may be formed as a passivation film by a plasma CVD method. In the case of using a silicon oxide film containing nitrogen, a silicon oxynitride film formed from $SiH_4$, $N_2O$, and $NH_3$, a silicon oxynitride film formed from $SiH_4$ and $N_2O$, or a silicon oxynitride film formed from a gas in which $SiH_4$ and $N_2O$ are diluted with Ar may be formed by a plasma CVD method.

A silicon oxynitride hydride film formed from $SiH_4$, $N_2O$, and $H_2$ may be used as the passivation film. Naturally, the structure of the passivation film is not limited to a single layer structure. The passivation film may have a single layer structure or laminated structure of another insulating layer containing silicon. In addition, a multilayer film of a carbon nitride film and a silicon nitride film, a multilayer film of styrene polymer, a silicon nitride film, or a diamond like carbon film may be substituted for the silicon oxide film containing nitrogen.

Then, a display portion is sealed. In the case of using an opposing substrate for sealing, the opposing substrate is attached by using an insulating sealant so that an external connection portion is exposed. A depression may be formed on the opposing substrate, and a drying agent may be attached thereto. A space between the opposing substrate and a substrate over which an element is formed may be filled with a dry inert gas such as nitrogen, or the opposing substrate may be formed by entirely applying a sealant to the pixel portion. It is preferable to use an ultraviolet curing resin or the like as the sealant. The sealant may be mixed with a drying agent or particles for keeping a gap constant. Then, the light emitting device is completed by attaching a flexible wiring board to the external connection portion.

Note that either an analog video signal or a digital video signal may be used for a light emitting display device of the invention having a display function. In the case of using a digital video signal, the video signal can be divided into a video signal using voltage and a video signal using current. A video signal, inputted to a pixel when a light emitting element emits light, includes a constant voltage video signal and a constant current video signal. The constant voltage video signal includes a signal in which voltage applied to a light emitting element is constant and a signal in which current applied to a light emitting element is constant. The constant current video signal includes a signal in which voltage applied to a light emitting element is constant and a signal in which current applied to a light emitting element is constant. Drive with the signal in which voltage applied to a light emitting element is constant is constant voltage drive, and that with the signal in which current applied to a light emitting element is constant is constant current drive. By constant current drive, constant current is applied to a light emitting element, regardless of a change in resistance of the light emitting element. For a light emitting display device of the invention and a driving method thereof, either a driving method using voltage of a video signal or a driving method using current of a video signal may be employed, and either constant voltage drive or constant current drive may be employed.

Hereinabove, a method for manufacturing a light emitting device of the invention is described.

Embodiment Mode 3

A method for manufacturing a light emitting device having the structure shown in FIG. 2B is described in this embodiment mode with reference to FIGS. 5A to 5D. Description up to formation of a base insulating layer 801, a semiconductor layer 802, a gate insulating layer 803, and a gate electrode 804 over a substrate 800 (FIG. 5A) is similar to the description of FIG. 3A in Embodiment Mode 2; therefore, the description is omitted here.

After forming the gate electrode 804, a first insulating layer 850 is formed. The first insulating layer 850 can be formed of an organic insulating layer of acrylic or polyimide, an inorganic insulating layer mainly containing silicon oxide or silicon nitride, siloxane, or the like. In this embodiment mode, silicon oxide is used for the first insulating layer 850. In the case of forming the first insulating layer 850 by applying a self-planarizing material of acrylic, polyimide, siloxane, or the like, the light emitting device has such a structure as shown in FIG. 2A.

A contact hole is formed to penetrate the first insulating layer 850 and the gate insulating layer 803. Then, a conductive layer is formed to cover the contact hole and the first insulating layer 850. The conductive layer is processed to have a desired shape, thereby forming electrodes 851 and 852 and a wiring (not shown). They may be single layers of aluminum, copper, or the like; however, they may be formed to have laminated structures. As a laminated wiring, the following laminated structure can be employed: molybdenum, aluminum, and molybdenum; titanium, aluminum, and titanium; titanium, titanium nitride, aluminum, and titanium; or the like, from a semiconductor layer side.

Since silicon oxide is used for the first insulating layer 850 in this embodiment mode, an etching stopper film need not be formed. However, in the case of using, for the first insulating layer 850, a material without a sufficient difference in an etching rate at the time of etching the electrodes 851 and 852 and the wiring (not shown), an etching stopper film needs to be formed. In that case, after forming the electrodes 851 and 852 and the wiring, an exposed portion of the etching stopper film is preferably removed using the electrodes and the wiring as a mask.

The conductive layer may be processed and the contact hole may be formed by dry etching or wet etching using a resist. When wet etching is employed or the resist is removed by using a separating solution, the insulating layer is exposed to water. Therefore, heat treatment may be performed after removing the resist. Heat treatment can be performed in any condition of atmospheric air, reduced pressure, a vacuum, and a specific gas atmosphere. The treatment may be performed in a favorable condition. However, heat treatment for dehydration is not necessarily required in some cases, when the first insulating layer 850 is highly water impermeable.

Figure 5A:
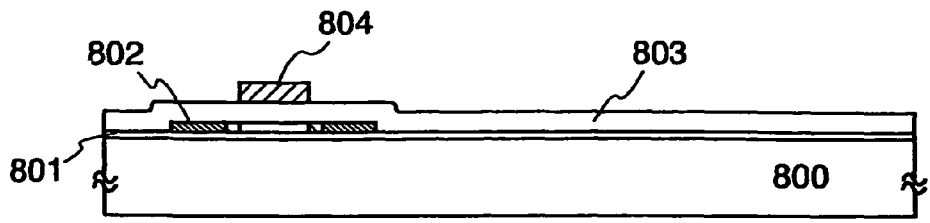
FIGS. 5A to 5D are cross-sectional views showing a method for manufacturing a light emitting device of the invention.
Figure 5B:
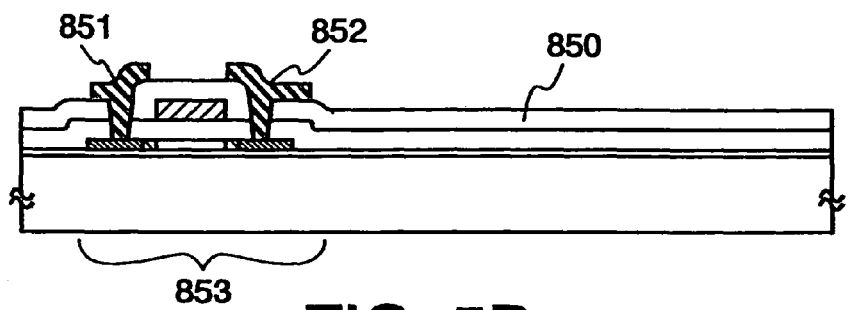

According to the steps, a thin film transistor 853 in a pixel portion is completed (FIG. 5B)

Figure 5C:
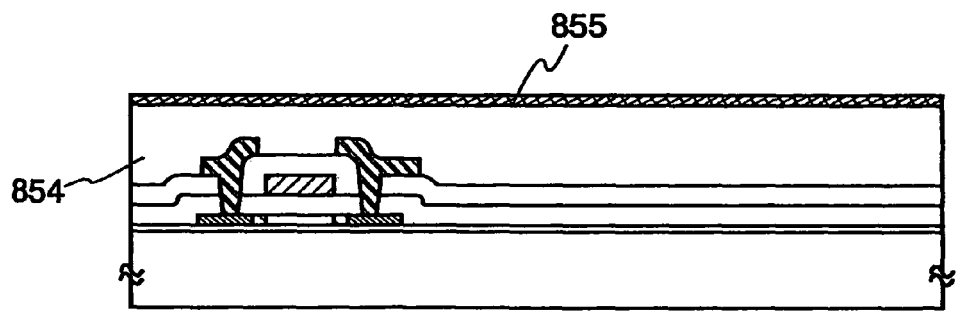

Subsequently, a second insulating layer 854 is formed to cover the electrodes 851 and 852, the wiring, and the first insulating layer 850. The second insulating layer 854 may be formed of a similar material to the above-mentioned material of the first insulating layer 850. In this embodiment mode, the first insulating layer 850 is formed of silicon oxide which does not have a self-planarizing property and directly reflects irregularity thereunder. Therefore, the second insulating layer is formed of a self-planarizing material of acrylic, polyimide, or siloxane. In this embodiment mode, siloxane is used for the second insulating layer 854 (FIG. 5C).

An etching stopper film 855 is formed over the second insulating layer 854. The etching stopper film 855 is formed of a water impermeable material different from the second insulating layer 854. Specifically, the etching stopper film is formed of a material having high selectivity to a wiring 856 and a first electrode 857 of a light emitting element to be formed later, such as silicon nitride or silicon nitride containing oxygen. Note that conductivity is not necessarily required for a material of the etching stopper film. In this embodiment mode, a silicon nitride film is formed as the etching stopper film 855.

Figure 5D:
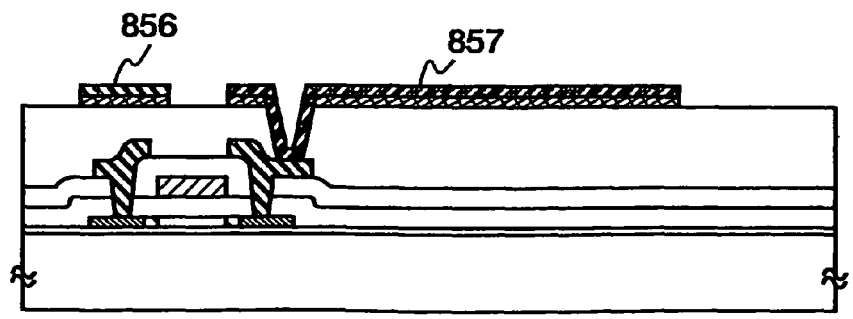

After forming the etching stopper film 855, a conductive film is formed thereover and processed to form a wiring 856. The wiring 856 corresponds to the wiring 310 in FIG. 2A. Since the etching stopper film 855 is formed, the wiring 856 can be formed without largely etching a lower film at the time of etching the conductive film (FIG. 5D).

A first electrode 857 of a light emitting element is formed. The first electrode 857 is electrically connected to the electrode 852 of the thin film transistor 853 through a contact hole formed in the second insulating layer 854. After forming a light transmitting conductive layer, the first electrode 857 is formed by processing the conductive layer. The first electrode 857 may be formed of ITO (indium tin oxide), ITO containing silicon oxide, IZO (Indium Zinc Oxide) in which indium oxide contains zinc oxide of 2% to 20%, zinc oxide, GZO (Gallium Zinc Oxide) in which zinc oxide contains gallium, or the like.

The conductive layer may be processed by dry etching or wet etching using a resist. When wet etching is employed or the resist is removed by using a separating solution, it is conceivable that water enters the second insulating layer 854. Therefore, heat treatment may be performed to remove water in the second insulating layer 854 after removing the resist. Heat treatment can be performed in any condition of atmospheric air, reduced pressure, a vacuum, and a specific gas atmosphere. The treatment may be performed in a favorable condition. However, water cannot be sufficiently removed in some cases, since the second insulating layer 854 is covered with the etching stopper film 855.

An exposed portion of the etching stopper film 855 is removed by etching using the wiring 856 and the first electrode 857 of the light emitting element as a mask. The etching may be performed by either wet etching or dry etching. In this embodiment mode, dry etching is employed. Note that the first electrode 857 and the etching stopper film 855 may be simultaneously etched, in the case of employing an etching method having higher selectivity between the first electrode 857, and the second insulating layer 854 and the wiring 856. When the first electrode 857 and the wiring 856 can have high selectivity to the second insulating layer 854, the etching stopper film need not be formed. The etching stopper film may be used only at the time of forming either of them.

When wet etching is employed, it is conceivable that water enters the second insulating layer 854. Therefore, heat treatment may be performed to remove water in the second insulating layer 854 after removing the resist. Since the second insulating layer 854 is not covered with the etching stopper film 855, water can be sufficiently removed. In the case where there is a step of exposing to water again in the following steps, heat treatment may be performed at a time later after the step. Heat treatment can be performed in any condition of atmospheric air, reduced pressure, a vacuum, and a specific gas atmosphere. The treatment may be performed in a favorable condition.

Subsequent steps are similar to those in FIG. 4C and later; therefore, description is omitted.

Hereinabove, a method for manufacturing a light emitting device of the invention is described. Note that the method for manufacturing a light emitting device in this embodiment mode can be appropriately combined with that in Embodiment Mode 2.

Embodiment Mode 4

Figure 6:
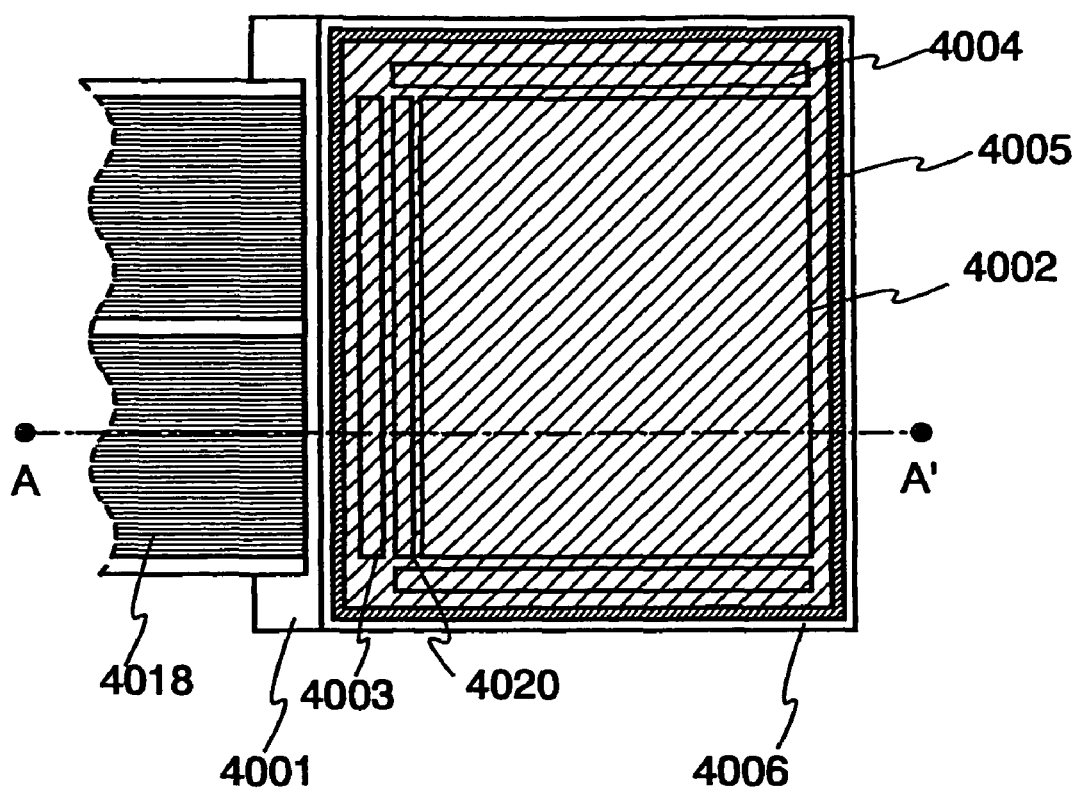
FIG. 6 is a top view showing an example of a module structure of the invention.

The appearance of a panel of a light emitting device which corresponds to one mode of the invention is described in this embodiment mode with reference to FIG. 6. FIG. 6 is a top view of a panel in which a transistor and a light emitting element formed over a substrate are sealed with a sealant formed between the substrate and an opposing substrate 4006.

A sealant 4005 is provided to surround a pixel portion 4002, a signal processing circuit 4003, a signal line driver circuit 4020, and a scanning line driver circuit 4004 which are provided over a substrate 4001. The opposing substrate 4006 is provided over the pixel portion 4002, the signal processing circuit 4003, the signal line driver circuit 4020, and the scanning line driver circuit 4004. Thus, the pixel portion 4002, the signal processing circuit 4003, the signal line driver circuit 4020, and the scanning line driver circuit 4004 are sealed with the substrate 4001, the sealant 4005, and the opposing substrate 4006, together with a filler.

The pixel portion 4002, the signal processing circuit 4003, the signal line driver circuit 4020, and the scanning line driver circuit 4004 which are provided over the substrate 4001 have a plurality of thin film transistors.

A lead wiring corresponds to a wiring for supplying signals or power voltage to the pixel portion 4002, the signal processing circuit 4003, the signal line driver circuit 4020, and the scanning line driver circuit 4004. The lead wiring is connected to a connection terminal, and the connection terminal is electrically connected to a terminal included in a flexible printed circuit (FPC) 4018 through an anisotropic conductive film.

An ultraviolet curing resin or a thermosetting resin as well as an inert gas such as nitrogen or argon can be used as the filler. Polyvinyl chloride, acrylic, polyimide, an epoxy resin, a silicone resin, polyvinyl butyral, or ethylene vinylene acetate can be used.

A display device of the invention includes, in its category, a panel provided with a pixel portion having a light emitting element and a module in which an IC is mounted on the panel.

Embodiment Mode 5

Examples of an electronic device of the invention mounted with a module, one of whose example is described in Embodiment Mode 4, can be cited as follows: a camera such as a video camera or a digital camera, a goggle type display (head mounted display), a navigation system, an audio reproducing device (a car audio component or the like), a computer, a game machine, a portable information terminal (a mobile computer, a cellular phone, a portable game machine, an electronic book, or the like), and an image reproducing device including a recording medium (specifically, a device capable of processing data in a recording medium such as a Digital Versatile Disc (DVD) and having a display that can display the image of the data), and the like. Practical examples of these electronic devices are shown in FIGS. 7A to 7E.

FIG. 7A shows a light emitting display device. A television set, a computer monitor, or the like is regarded as this. The light emitting display device includes a chassis 2001, a display portion 2003, a speaker portion 2004, and the like. In the light emitting display device according to the invention, the variation in an emission spectrum depending on a viewing angle with respect to a side from which luminescence is extracted in the display portion 2003 can be reduced, and display quality is improved. A pixel portion is preferably provided with a polarizing plate or a circularly polarizing plate to enhance contrast. For example, a quarter-wave plate, a half-wave plate, and a polarizing plate may be sequentially formed over a sealing substrate. Further, an anti-reflective film may be provided over the polarizing plate.

FIG. 7B shows a cellular phone, which includes a main body 2101, a chassis 2102, a display portion 2103, an audio input portion 2104, an audio output portion 2105, an operation key 2106, an antenna 2108, and the like. In the cellular phone according to the invention, the deterioration of a light emitting element in the display portion 2103 is suppressed, thereby improving reliability.

FIG. 7C shows a computer, which includes a main body 2201, a chassis 2202, a display portion 2203, a keyboard 2204, an external connection port 2205, a pointing mouse 2206, and the like. In the computer according to the invention, the variation in an emission spectrum depending on a viewing angle with respect to a side from which luminescence is extracted in the display portion 2203 can be reduced, and display quality is improved. Although a laptop computer is shown in FIG. 7C as an example, the invention can be applied to a desktop computer in which a hard disk and a display portion are integrated, and the like.

FIG. 7D shows a mobile computer, which includes a main body 2301, a display portion 2302, a switch 2303, operation keys 2304, an infrared port 2305, and the like. In the mobile computer according to the invention, the deterioration of a light emitting element in the display portion 2302 is suppressed, thereby improving reliability.

FIG. 7E shows a portable gaming machine, which includes a chassis 2401, a display portion 2402, a speaker portion 2403, operation keys 2404, a recording medium insertion portion 2405, and the like. In the portable gaming machine according to the invention, the deterioration of a light emitting element in the display portion 2402 is suppressed, thereby improving reliability.

As described above, the applicable range of the invention is so wide that the invention can be applied to electronic devices of various fields.

Embodiment Mode 6

A structure of a light emitting layer is described in detail in this embodiment mode.

The light emitting layer may be made of a charge injection transport material and a light emitting material including an organic compound or inorganic compound. The light emitting layer includes one or plural kinds of layers of a low molecular weight organic compound, an intermediate molecular weight organic compound (referring to an organic compound which does not have sublimation property and has the number of molecules of 20 or less or a molecular chain length of 10 μm or less), and a high molecular weight organic compound. The light emitting layer may be combined with an electron injection transport or hole injection transport inorganic compound.

As a highly electron transporting material among charge injection transport materials, a metal complex that has a quinoline skeleton or a benzoquinoline skeleton such as tris(8-quinolinolato)aluminum [$Alq_3$], tris(5-methyl-8-quinolinolato)aluminum [$Almq_3$], bis(10-hydroxybenzo[h]-quinolinato)beryllium [$BeBq_2$], or bis(2-methyl-8-quinolinolato)-4-phenylphenolato-aluminum [BAlq], or the like can be used. As a highly hole transporting material, an aromatic amine compound (that is, a compound having a benzene ring-nitrogen bond) such as 4,4'-bis[N-(1-naphthyl)-N-phenyl-amino]-biphenyl [α-NPD], 4,4'-bis[N-3-methylphenyl)-N-phenyl-amino]-biphenyl [TPD], 4,4',4''-tris(N,N-diphenyl-amino)-triphenylamine [TDATA], or 4,4',4''-tris[N-(3-methylphenyl)-N-phenyl-amino]-triphenylamine [MTDATA] can be used.

As a highly electron injecting material among charge injection transport materials, a compound of an alkali metal or an alkaline earth metal such as lithium fluoride (LiF), cesium fluoride (CsF), or calcium fluoride ($CaF_2$) can be used. In addition, the highly electron injecting material may be a mixture of a highly electron transporting material such as $Alq_3$ and an alkaline earth metal such as magnesium (Mg).

As a highly hole injecting material among charge injection transport materials, metal oxide such as molybdenum oxide (MoOx), vanadium oxide (VOx), ruthenium oxide (RuOx), tungsten oxide (WOx), or manganese oxide (MnOx) can be used. In addition, a phthalocyanine compound such as phthalocyanine [$H_2Pc$] or copper phthalocyanine (CuPC) can be used.

The light emitting layer may have a structure for performing color display by providing each pixel with light emitting layers having different emission wavelength bands. Typically, a light emitting layer corresponding to each color of R (red), G (green), and B (blue) is formed. In this case, color purity can be increased and a pixel portion can be prevented from having a mirror surface (glare) by providing a light emitting side of a pixel with a filter (colored layer) which transmits light of an emission wavelength band. Providing a filter (colored layer) can omit a circularly polarizing plate or the like which is conventionally used to prevent a pixel portion from having a mirror surface (glare) and can eliminate the loss of light that light is reduced to half due to the use of a polarizing plate. Further, a change in hue, which occurs when a pixel portion (display screen) is obliquely seen, can be reduced.

A light emitting material includes various materials. As a low molecular weight organic light emitting material, 4-dicyanomethylene-2-methyl-6-[2-(1,1,7,7-tetramethyl-9-julolidyl)ethenyl]-4H-pyran [DCJT], 4-dicyanomethylene-2-t-butyl-6-[2-(1,1,7,7-tetramethyl julolidine-9-yl)ethenyl]-4H-pyran [DCJTB], periflanthene, 2,5-dicyano-1,4-bis[2-(10-methoxy-1,1,7,7-tetramethyl julolidine-9-yl)ethenyl]benzene, N,N-dimethyl quinacridon [DMQd], coumarin 6, coumarin 545T, tris(8-quinolinolate)aluminum [$Alq_3$], 9,9'-bianthryl, 9,10-diphenylanthracene [DPA], 9,10-bis(2-naphthyl)anthracene [DNA], or the like can be used. In addition, another material can also be used.

A high molecular weight organic light emitting material is physically stronger than a low molecular weight material and is superior in durability of the element. In addition, a high molecular weight material can be used for application; therefore, the element is relatively easily manufactured. A structure of a light emitting element using a high molecular weight organic light emitting material is basically the same as that of a light emitting element using a low molecular weight organic light emitting material: a cathode, an organic light emitting layer, and an anode from the side of a semiconductor layer. However, it is difficult to form such a laminated structure as in the case of using a low molecular weight organic light emitting material, when a light emitting layer using a high molecular weight organic light emitting material is formed. A two-layer structure is employed in many cases. Specifically, the light emitting element using a high molecular weight organic light emitting material has a structure of a cathode, a light emitting layer, a hole transport layer, and an anode from the side of a semiconductor layer.

The emission color is determined by the material of the light emitting layer. Therefore, a light emitting element that emits desired light can be formed by selecting an appropriate material of the light emitting layer. As a high molecular weight light emitting material that can be used to form the light emitting layer, a polyparaphenylene-vinylene-based material, a polyparaphenylene-based material, a polythiophen-based material, or a polyfluorene-based material can be used.

As a polyparaphenylene-vinylene-based material, a derivative of poly(paraphenylene vinylene) [PPV], for example, poly(2,5-dialkoxy-1,4-phenylene vinylene) [RO-PPV], poly(2-(2'-ethyl-hexoxy)-5-methoxy-1,4-phenylene vinylene) [MEH-PPV], poly(2-(dialkoxyphenyl)-1,4-phenylene vinylene) [ROPh-PPV], or the like can be used. As a polyparaphenylene-based material, a derivative of polyparaphenylene [PPP], for example, poly(2,5-dialkoxy-1,4-phenylene) [RO-PPP], poly(2,5-dihexoxy-1,4-phenylene), or the like can be used. As a polythiophene-based material, a derivative of polythiophene [PT], for example, poly(3-alkylthiophene) [PAT], poly(3-hexylthiophene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)-thiophene] [POPT], poly[3-(4-octylphenyl)-2,2 bithiophene] [PTOPT], or the like can be used. As the polyfluorene-based material, a derivative of polyfluorene [PF], for example, poly(9,9-dialkylfluorene) [PDAF], poly(9,9-dioctylfluorene) [PDOF], or the like can be used.

Note that a hole injection property from an anode can be enhanced by interposing a high molecular weight organic light emitting material having a hole transporting property between an anode and a high molecular weight organic light emitting material. This hole transporting material is generally dissolved into water together with an acceptor material, and the solution is applied by a spin coating method or the like. Since the hole transporting material is insoluble in an organic solvent, a laminate with the above-described organic light emitting material can be formed. A mixture of PEDOT and camphor sulfonic acid (CSA) that serves as an acceptor material, a mixture of polyaniline [PANI] and polystyrene sulfonic acid [PSS] that serves as an acceptor material, and the like can be used as the hole transporting high molecular weight organic light emitting material.

In addition, the light emitting layer can be formed to emit monochrome or white light. In the case of using a white light emitting material, a filter (colored layer) which transmits light having a specific wavelength is provided on a light emitting side of a pixel, thereby performing color display.

In order to form a light emitting layer which emits white light, for example, $Alq_3$, $Alq_3$ partially doped with Nile red that is a red light emitting pigment, p-EtTAZ, and TPD (aromatic diamine) are sequentially laminated by an evaporation method to obtain white light. When the light emitting layer is formed by an application method using spin coating, the layer after application is preferably baked by vacuum heating. For example, an aqueous solution of poly(ethylene dioxythiophene)/poly(styrene sulfonic acid) (PEDOT/PSS) may be entirely applied and baked to form a layer that functions as a hole injection layer. Then, a polyvinyl carbazole (PVK) solution doped with a light emitting center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) may be entirely applied and baked to form a layer that functions as a light emitting layer.

The light emitting layer may be formed to be a single layer. For example, a 1,3,4-oxadiazole derivative (PBD) having an electron transporting property may be dispersed in polyvinyl carbazole (PVK) having a hole transporting property. Another method to obtain white light emission is to disperse PBD of 30 wt % and to disperse four kinds of pigments (TPB, coumarin 6, DCM1, and Nile red) in appropriate amounts. In addition to the light emitting elements described here that provide white light emission, a light emitting element that provides red light emission, green light emission, or blue light emission can be manufactured by appropriately selecting materials of the light emitting layer.

Further, a triplet excitation light emitting material including a metal complex or the like as well as a singlet excitation light emitting material may be used for the light emitting layer. For example, among pixels emitting red, green, and blue light, a pixel emitting red light whose luminance is reduced by half in a relatively short time is made of a triplet excitation light emitting material and the rest are made of a singlet excitation light emitting material. A triplet excitation light emitting material has a characteristic that the material has a good luminous efficiency and consumes less power to obtain the same luminance. When a triplet excitation light emitting material is used for a red pixel, only small amount of current needs to be applied to a light emitting element. Thus, reliability can be improved. A pixel emitting red light and a pixel emitting green light may be formed of a triplet excitation light emitting material and a pixel emitting blue light may be formed of a singlet excitation light emitting material to achieve low power consumption. Low power consumption can be further achieved by forming a light emitting element which emits green light that has high visibility with a triplet excitation light emitting material.

A metal complex used as a dopant is an example of a triplet excitation light emitting material, and a metal complex having platinum that is a third transition series element as a metal center, a metal complex having iridium as a metal center, and the like are known. A triplet excitation light emitting material is not limited to the above compounds. A compound having the above described structure and an element belonging to any of Groups 8 to 10 of the periodic table as a metal center can also be used.

The above described materials for forming the light emitting layer are just examples. A light emitting element can be formed by appropriately laminating functional layers such as a hole injection transport layer, a hole transport layer, an electron injection transport layer, an electron transport layer, a light emitting layer, an electron blocking layer, and a hole blocking layer. Further, a mixed layer or a mixed junction may be formed by combining these layers. The layer structure of the light emitting layer can be varied. Instead of providing a specific electron injection region or light emitting region, modification such as providing an electrode for the purpose or providing a dispersed light emitting material is acceptable as long as it does not deviate from the scope of the invention.

A light emitting element formed with the above described material emits light by being biased in a forward direction. A pixel of a display device formed with a light emitting element can be driven by a simple matrix mode or an active matrix mode. In either mode, each pixel emits light by applying a forward bias thereto in specific timing, however, the pixel is in a non-light-emitting state for a certain period. Reliability of a light emitting element can be improved by applying a reverse bias at this non-light-emitting time. In a light emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating driving of applying a forward bias and a reverse bias. Thus, the reliability of a light emitting device can be improved.

Embodiment Mode 7

Figure 8A:
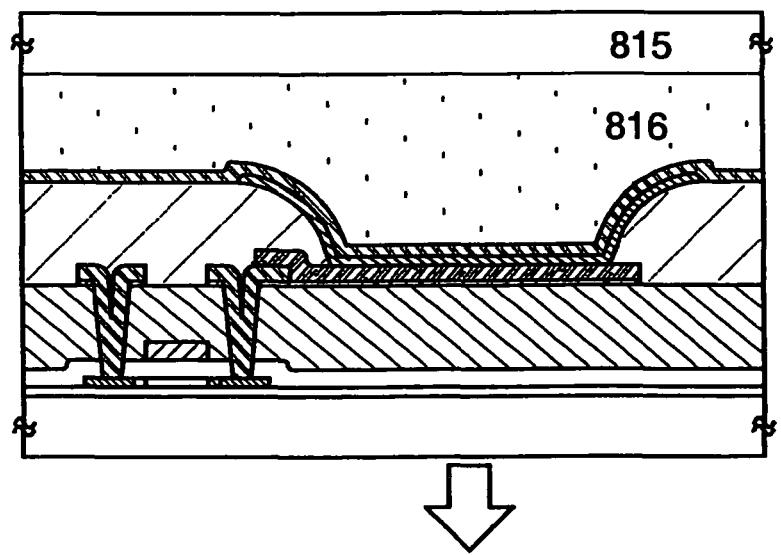
FIGS. 8A and 8B show examples of a structure of a light emitting device of the invention.
Figure 8B:
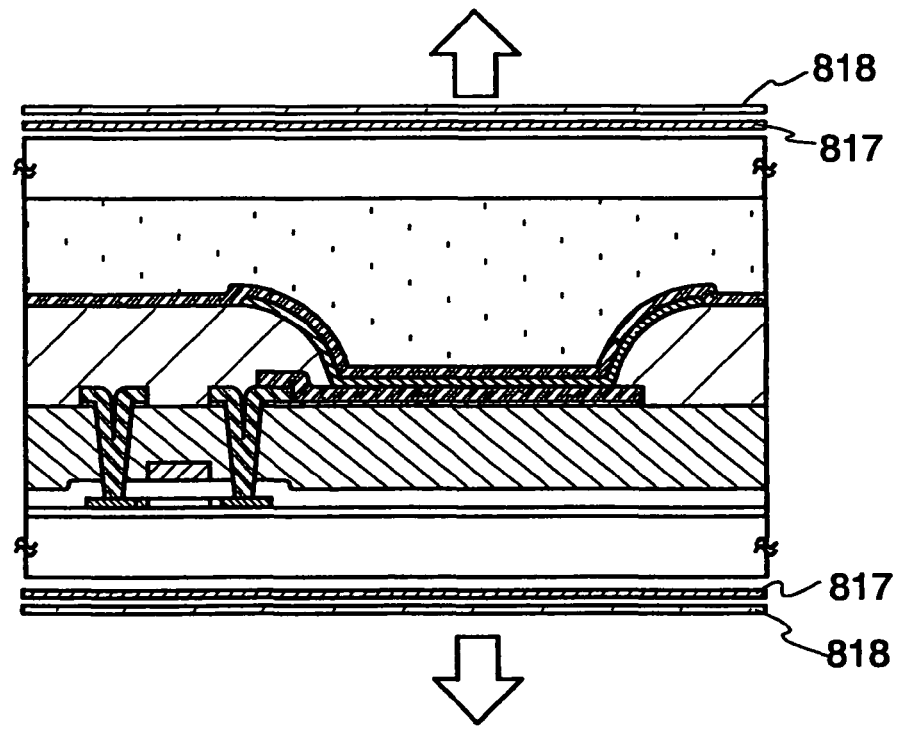

An example of a light emitting device using the invention is described in this embodiment mode with reference to FIGS. 8A and 8B. In this embodiment mode, a thin film transistor 809 having an LDD structure is connected to a light emitting element 814 through an electrode 808 of the thin film transistor.

FIG. 8A shows a structure in which a first electrode 810 is formed of a light transmitting conductive film and light emitted from a light emitting layer 812 is extracted to the side of a substrate 800. Note that reference numeral 815 denotes an opposing substrate and is fixed to the substrate 800 with the use of a sealant or the like after the light emitting element 814 is formed. A space between the opposing substrate 815 and the element is filled with a light transmitting resin 816 or the like, and sealing is performed. Accordingly, the deterioration of the light emitting element 814 due to moisture can be further suppressed. The resin 816 is preferably hygroscopic. When a highly light transmitting drying agent is dispersed in the resin 816, an influence of the moisture can be further reduced. Therefore, it is a more preferable mode.

FIG. 8B shows a structure in which both a first electrode 810 and a second electrode 813 are formed of a light transmitting conductive film and light can be emitted to both sides of a substrate 800 and an opposing substrate 815. In this structure, a screen can be prevented from being transparent by providing a polarizing plate 817 outside the substrate 800 and the opposing substrate 815, and visibility is increased. A protective film 818 is preferably provided outside the polarizing plate 817.

Embodiment Mode 8

A pixel circuit, a protective circuit, and operation thereof are described in this embodiment mode.

Figure 9A:
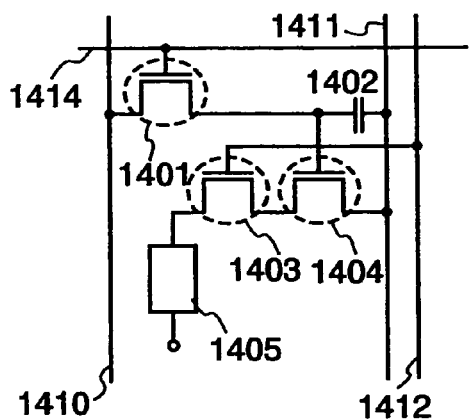
FIGS. 9A to 9F show examples of a pixel circuit.

In a pixel shown in FIG. 9A, a signal line 1410 and power supply lines 1411 and 1412 are arranged in a column direction and a scanning line 1414 is arranged in a row direction. In addition, the pixel includes a switching TFT 1401, a driving TFT 1403, a current control TFT 1404, a capacitor element 1402, and a light emitting element 1405.

Figure 9B:
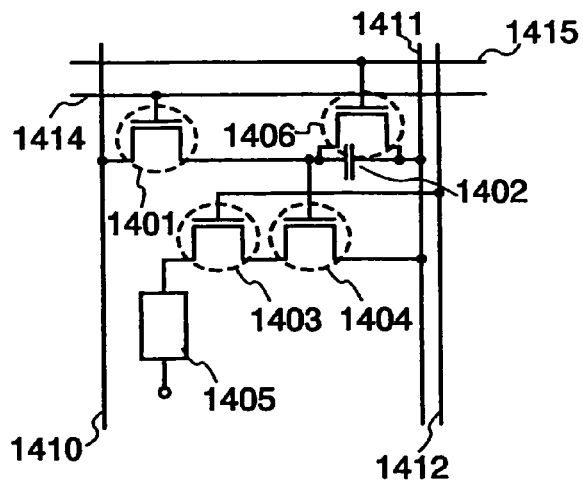
Figure 9C:
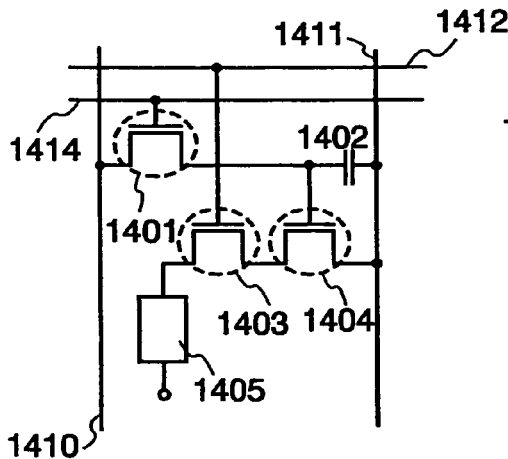
Figure 9D:
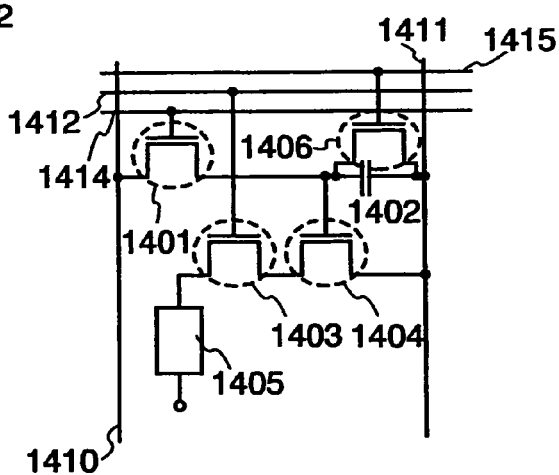

A pixel shown in FIG. 9C is different in the way that a gate electrode of a TFT 1403 is connected to a power supply line 1412 arranged in a row direction, but other than that, the pixel has a similar structure to that of the pixel shown in FIG. 9A. In other words, equivalent circuit diagrams of both of the pixels shown in FIGS. 9A and 9C are the same. However, each power supply line is formed using a conductive layer in a different layer when the power supply line 1412 is arranged in a column direction (FIG. 9A) and when the power supply line 1412 is arranged in a row direction (FIG. 9C). Here, a wiring connected to the gate electrode of the driving TFT 1403 is focused and the figures are separately shown in FIGS. 9A and 9C to show that the wirings are formed in different layers.

In the pixels shown in FIG. 9A and FIG. 9C, the TFTs 1403 and 1404 are connected in series. A channel length L(1403) and a channel width W(1403) of the TFT 1403 and a channel length L(1404) and a channel width W(1404) of the TFT 1404 are preferably set to satisfy L(1403)/W(1403): L(1404)/W(1404)=5 to 6000:1.

Note that the TFT 1403 operates in a saturation region and has a role of controlling the amount of electric current flowing through the light emitting element 1405, and the TFT 1404 operates in a linear region and has a role of controlling supply of electric current to the light emitting element 1405. It is preferable, from the viewpoint of the manufacturing steps, that the TFTs have the same conductivity. In this embodiment mode, the TFTs are formed to be n-channel TFTs. Further, the TFT 1403 may be a depletion mode TFT as well as an enhancement mode TFT. In the present invention having the above structure, the TFT 1404 operates in a linear region, so that slight variation in gate-source voltage (Vgs) of the TFT 1404 does not affect the amount of electric current of the light emitting element 1405. In other words, the amount of electric current of the light emitting element 1405 is determined by the TFT 1403 which operates in a saturation region. According to the above-described structure, luminance variation of the light emitting element, which is caused by the variation in characteristics of the TFT, can be improved, and a display device with improved image quality can be provided.

In pixels shown in FIGS. 9A to 9D, the TFT 1401 controls the input of a video signal to the pixel. When the TFT 1401 is turned on, the video signal is inputted to the pixel. Then, voltage of the video signal is stored in the capacitor element 1402. FIGS. 9A and 9C each show a structure in which the capacitor element 1402 is provided; however, the invention is not limited thereto. When a gate capacitor or the like can be used as the capacitor that can hold a video signal, the capacitor element 1402 may not be provided.

The pixel shown in FIG. 9B has the same structure as that of the pixel shown in FIG. 9A except that a TFT 1406 and a scanning line 1415 are added. In the same manner, the pixel shown in FIG. 9D has the same structure as that of the pixel shown in FIG. 9C except that a TFT 1406 and a scanning line 1415 are added.

In the TFT 1406, "on" or "off" is controlled by the scanning line 1415 that is newly arranged. When the TFT 1406 is turned on, an electric charge held in the capacitor element 1402 is discharged, and the TFT 1404 is then turned off. In other words, it is possible to make a state in which current is forced not to flow through the light emitting element 1405 by arranging the TFT 1406. Therefore, the TFT 1406 can be referred to as an erasing TFT. Accordingly, in the structures in FIGS. 9B and 9D, a lighting period can be started simultaneously with or immediately after the start of a writing period without waiting for the writing of signals in all pixels. Consequently, a duty ratio can be improved.

Figure 9E:
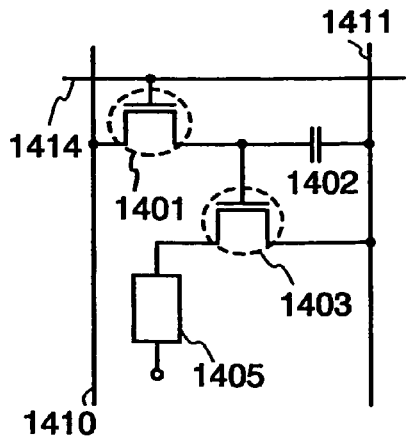
Figure 9F:
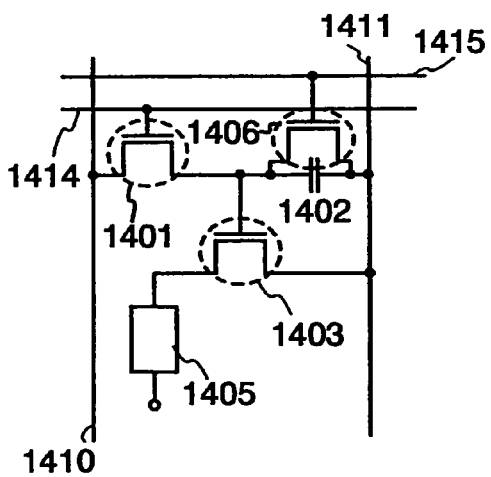

In a pixel shown in FIG. 9E, a signal line 1410 and a power supply line 1411 are arranged in a column direction, and a scanning line 1414 is arranged in a row direction. In addition, the pixel includes a switching TFT 1401, a driving TFT 1403, a capacitor element 1402, and a light emitting element 1405. A pixel shown in FIG. 9F has the same structure as that of the pixel shown in FIG. 9E except that a TFT 1406 and a scanning line 1415 are added. A duty ratio can be increased by arranging the TFT 1406 also in the structure of FIG. 9F.

As described above, various pixel circuits can be adopted. It is preferable to make a semiconductor film of a driving TFT large specifically in the case of forming a thin film transistor with an amorphous semiconductor film or the like. Therefore, the pixel circuit is preferably a top emission type, which emits light from an electroluminescent layer to the side of a sealing substrate.

Such an active matrix light emitting device is considered to be advantageous to low voltage driving when a pixel density is increased, since each pixel is provided with TFTs.

In this embodiment mode, an active matrix light emitting device in which each pixel is provided with TFTs is described. However, a passive matrix light emitting device in which every column is provided with TFTs can be formed. In the passive matrix light emitting device, TFTs are not provided for each pixel; therefore, a high aperture ratio can be obtained. In the case of a light emitting device which emits light to the both sides of an electroluminescent layer, transmittance can be increased by using the passive matrix display device.

The case of providing a scanning line and a signal line with a diode as a protective circuit is described with reference to an equivalent circuit shown in FIG. 9E.

Figure 10:
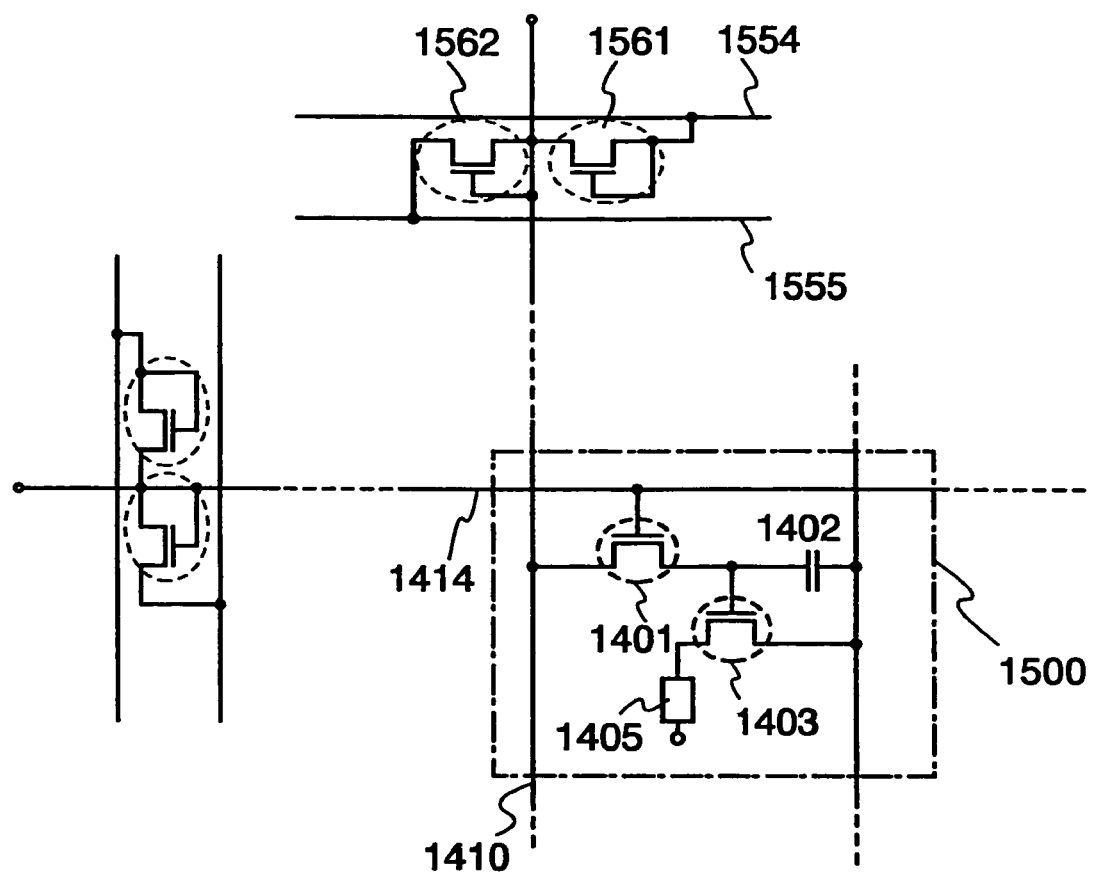
FIG. 10 shows an example of a protective circuit.

In FIG. 10, a pixel portion 1500 is provided with TFTs 1401 and 1403, a capacitor element 1402, and a light emitting element 1405. A signal line 1410 is provided with diodes 1561 and 1562. The diodes 1561 and 1562 are manufactured according to the above embodiment mode as in the case of the TFT 1401 or 1403 and include a gate electrode, a semiconductor layer, a source electrode, a drain electrode, and the like. The diodes 1561 and 1562 operate by connecting the gate electrode to the drain electrode or the source electrode.

Common potential lines 1554 and 1555 connected to the diodes are formed in the same layer as the gate electrode. Therefore, a contact hole needs to be formed in a gate insulating layer to connect the gate electrode to the source electrode or the drain electrode of the diode.

A diode provided for a scanning line 1414 has a similar structure.

Thus, a protective diode provided for an input stage can be simultaneously formed according to the invention. Note that a position where the protective diode is formed is not limited thereto, and the protective diode can be provided between a driver circuit and a pixel.

Embodiment 1

A comparison of the number of regions where emission intensity was decreased was made, between a light emitting device to which the invention was applied (Example 1) and a light emitting device to which the invention was not applied as a comparative example (Comparative Example 1), after using the light emitting devices for a certain period of time under given conditions. Note that a structure of the light emitting device, Example 1, corresponds to the structure shown in FIG. 1A. A structure of the light emitting device, Comparative Example 1, corresponds to a structure in which the etching stopper film 114 is entirely formed over the insulating layer 107 in FIG. 1A. The result of comparison is shown in Table 1. Note that the etching stopper film was formed of a material which mainly contains silicon nitride in this embodiment.

TABLE 1

| | number of regions where emission intensity is decreased |
|---|---|
| Comparative Example 1 | 0 |
| Example 1 | 9 |

*Temperature: 85° C., after 100 hours

Table 1 shows the increased number of regions where emission intensity was decreased, which was visually counted by examining a picture taken after performing a storage test at the temperature of 85° C. for 100 hours. The number of large-area regions across a plurality of pixels, where emission intensity was decreased was counted. As shown in Table 1, a region where emission intensity was decreased did not newly appear in the light emitting device having the structure of the invention, even after 100 hours at 85° C. On the other hand, in Comparative Example 1, many regions where emission intensity was decreased newly appeared after the same period of time under the same conditions.

Embodiment 2

A comparison of the number of regions where emission intensity was decreased was made, between a light emitting device to which the invention was applied (Example 2) and light emitting devices to which the invention was not applied as comparative examples (Comparative Examples 2 to 5), after using the light emitting devices for a certain period of time under given conditions. Note that a structure of the light emitting device, Example 2, corresponds to the structure shown in FIG. 1B. The structure was manufactured by controlling etching time to etch at the same time as etching of the electrodes 108 and 109 so that the etching stopper film 115 was removed.

Structures of the light emitting devices, Comparative Examples 2 to 5, correspond to a structure in which the etching stopper film 115 is entirely formed over the insulating layer 107 in FIG. 1B. A remaining film thickness means a thickness of the etching stopper film 115 except between the electrodes 108 and 109 and the insulating layer 107. Conditions were set by changing a thickness of the etching stopper film 115 at the time of formation. The result of comparison is shown in Table 2. Note that the etching stopper film was formed of a material which mainly contains silicon nitride in this embodiment.

TABLE 2

| | remaining film thickness (nm) | number of pixels where emission intensity is decreased |
|---|---|---|
| Example 2 | 0 | 0 |
| Comparative Example 2 | 30 | 84 |
| Comparative Example 3 | 60 | 104 |
| Comparative Example 4 | 60 | 62 |
| Comparative Example 5 | 90 | 42 |

*Temperature: 85° C., after 80 hours

Table 2 shows the increased number of pixels where emission intensity was decreased, which was visually counted after performing a storage test at a temperature of 85° C. for 80 hours. Table 2 shows the number counted pixel by pixel differently from Table 1. As shown in Table 2, a pixel where emission intensity was decreased did not newly appear in the light emitting device having a structure of the invention, even after 80 hours at 85° C. On the other hand, in Comparative Examples 2 to 5, many pixels where emission intensity was decreased newly appeared after the same period of time under the same conditions, although there were differences in the number.

Figure 12A:
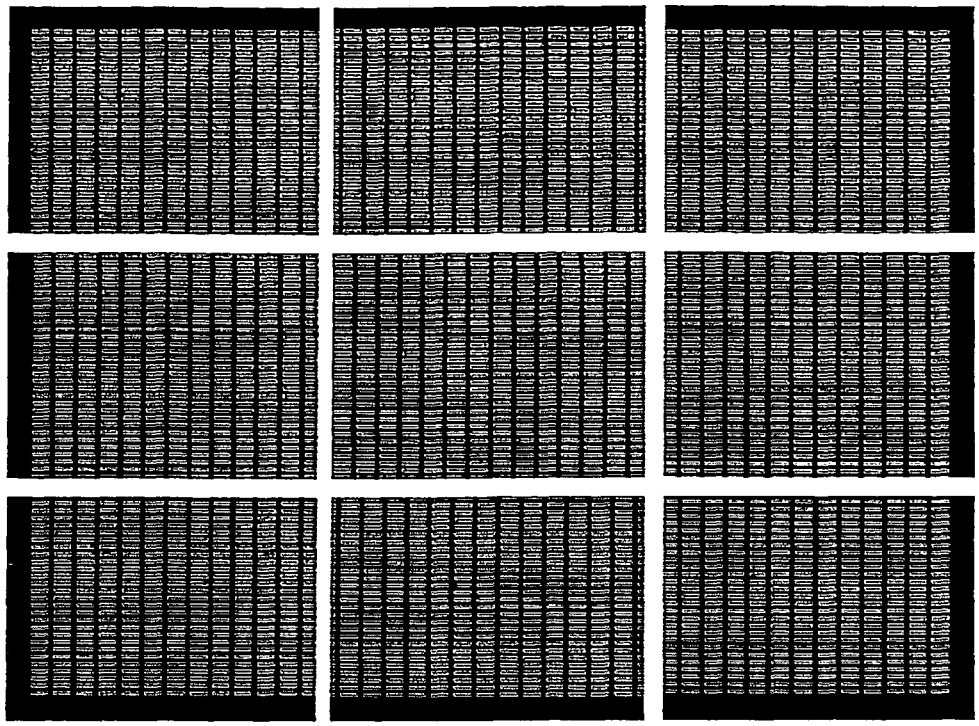
FIGS. 12A and 12B are pictures showing an upper surface of a light emitting device of the invention.
Figure 12B:
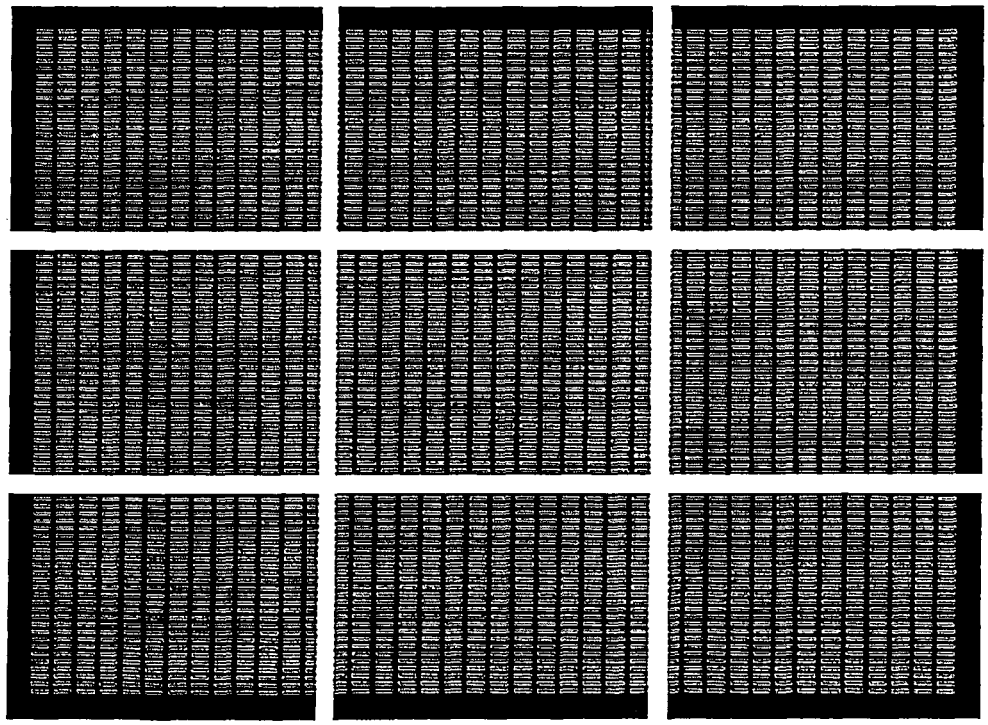

FIGS. 12A and 12B are pictures of the light emitting device having a structure corresponding to FIG. 1B, similarly to Example 2, which are taken with all pixels turned on. A brightly displaying portion corresponds to a pixel. Note that a light emitting material which emits green light is used for the light emitting device shown in FIGS. 12A and 12B. FIGS. 12A and 12B show four corners, side portions between the corners, and the center of a pixel portion in the light emitting device, but do not show an entire pixel portion.

FIG. 12A is a picture taken before performing a storage test at 85° C. Display is favorably performed without a pixel where emission intensity is decreased. FIG. 12B is a picture taken with all pixels turned on after storage at 85° C. for 1024 hours. The favorable display is maintained without generating a pixel where light intensity is decreased, even after 1024 hours at 85° C.

Figure 13A:
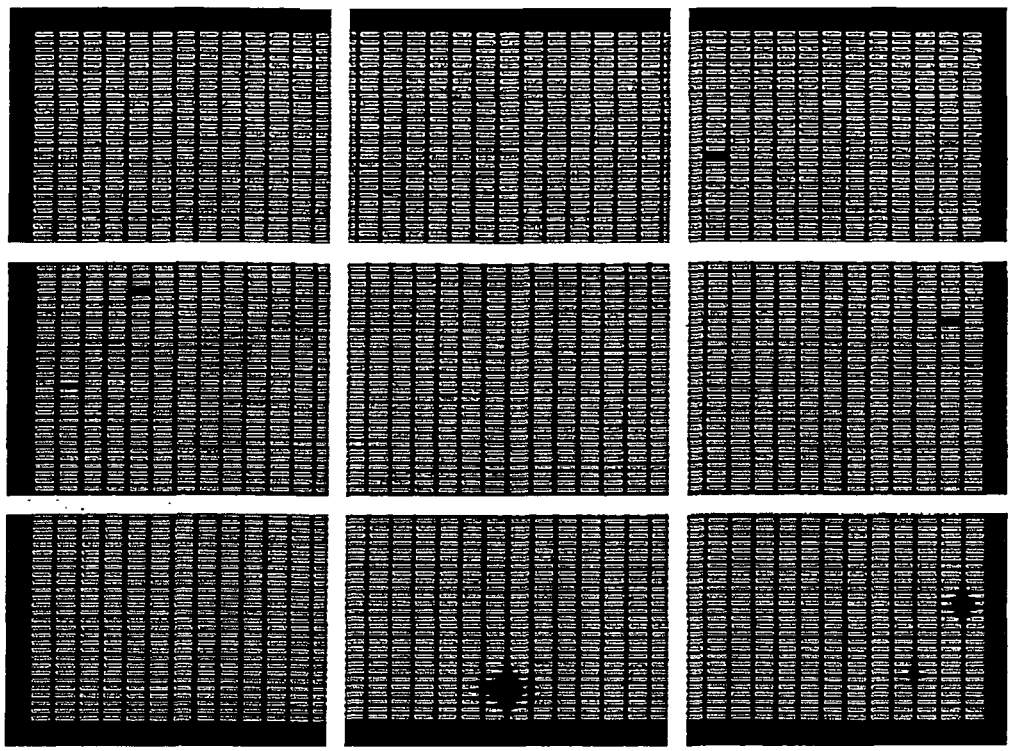
FIGS. 13A and 13B are pictures showing an upper surface of a light emitting device of the invention.
Figure 13B:
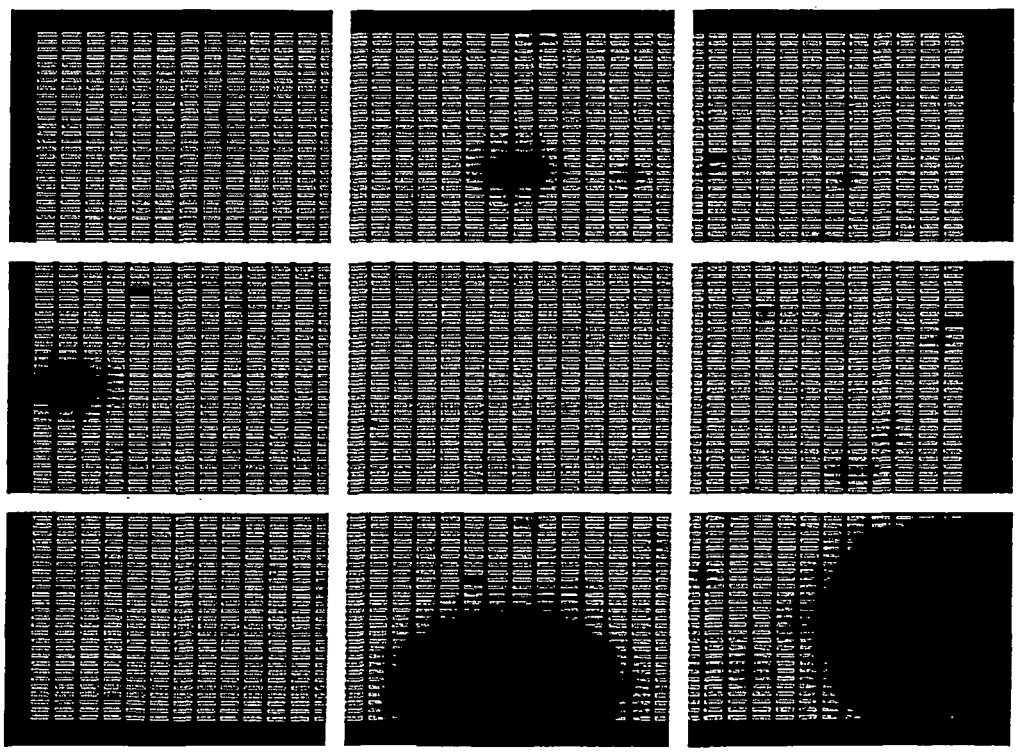

FIGS. 13A and 13B are pictures of a light emitting device, Comparative Example 6, in which the etching stopper film 115 is entirely formed over the insulating layer 107 in FIG. 1B, which are taken with all pixels turned on. Similarly to Example 2, a brightly displaying portion corresponds to a pixel, and a light-emitting material which emits green light is used. FIGS. 13A and 13B show four corners, side portions between the corners, and the center of a pixel portion in the light emitting device, but do not show an entire pixel portion.

FIG. 13A is a picture taken before performing a storage test at 85° C. Regions where emission intensity is decreased exist in parts. However, initial failure and deterioration cannot be distinguished from each other at this time. FIG. 13B is a picture taken with all pixels turned on after storage at 85° C. for 1024 hours. It is found that the number and the area of regions where pixel emission intensity is decreased are drastically increased in the light emitting device, Comparative example 6, having the above described structure, after 1024 hours at 85° C., compared with the state before performing the storage test. In particular, the area of the region where emission intensity is decreased, which existed across a plurality of pixels, is significantly enlarged compared with the state before performing the storage test. In the structure of FIG. 13A or 13B, the etching stopper film is entirely formed over the insulating layer. Therefore, water in the insulating layer cannot be sufficiently removed during the step of forming the light emitting device. Further, the water remaining in the insulating layer seeps, in a concentrated manner, from a tiny pinhole in the etching stopper film or at the boundary with an electrode or the like. Therefore, the pixel located in the periphery of the portion where water seeps is deteriorated. This is a conceivable reason for generating the region where emission intensity is decreased and enlarging the region.

It is found that the deterioration of a light emitting element can be effectively suppressed by using the structure of the invention as described above.

This application is based on Japanese Patent Application serial No. 2004-091710 filed in Japan Patent Office on Mar. 26, 2004, the entire contents of which are hereby incorporated by reference.

What is claimed is:

1. A method for manufacturing a light emitting device comprising the steps of:
    forming a thin film transistor over a substrate;
    forming an insulating layer over the thin film transistor;
    forming a film over the insulating layer;
    forming a contact hole through the insulating layer and the film;
    forming a first electrode over the film, the first electrode being electrically connected to the thin film transistor through the contact hole;
    removing a part of the film by using the first electrode as a mask;
    forming a bank over the first electrode so as to cover an edge of the film and the first electrode;
    forming a light emitting layer over the first electrode; and
    forming a second electrode over the light emitting layer.

2. The method for manufacturing a light emitting device according to claim 1, wherein the film is a silicon nitride film.

3. The method for manufacturing a light emitting device according to claim 1, wherein a side surface of the film is coplanar with a side surface of the first electrode.

4. A method for manufacturing a light emitting device comprising the steps of:
    forming a thin film transistor over a substrate;
    forming an insulating layer over the thin film transistor;
    forming a film over the insulating layer;
    forming a contact hole through the insulating layer and the film;
    forming a first electrode over the film, the first electrode being electrically connected to the thin film transistor through the contact hole;
    forming a second electrode being electrically connected to the first electrode;
    removing a part of the film by using the second electrode as a mask;
    forming a bank over the second electrode so as to cover an edge of the film and the second electrode;
    forming a light emitting layer over the second electrode; and
    forming a third electrode over the light emitting layer.

5. The method for manufacturing a light emitting device according to claim 4, wherein the film is a silicon nitride film.

6. The method for manufacturing a light emitting device according to claim 4, wherein a side surface of the film is coplanar with a side surface of the second electrode.

7. A method for manufacturing a light emitting device comprising the steps of:
    forming a thin film transistor over a substrate;
    forming an insulating layer over the thin film transistor;
    forming a film over the insulating layer;
    forming a contact hole through the insulating layer and the film;
    forming a first electrode over the film, the first electrode being electrically connected to the thin film transistor through the contact hole;
    removing a part of the film by using the first electrode as a mask;
    forming a bank over the first electrode so as to cover an edge of the film and the first electrode;
    performing a heat treatment to the insulating layer;
    forming a light emitting layer over the first electrode; and
    forming a second electrode over the light emitting layer.

8. The method for manufacturing a light emitting device according to claim 7, wherein the heat treatment is performed in a vacuum.

9. The method for manufacturing a light emitting device according to claim 7, wherein the light emitting film and the second electrode are formed without exposing to atmospheric air after performing the heat treatment.

10. The method for manufacturing a light emitting device according to claim 7, wherein the film is a silicon nitride film.

11. The method for manufacturing a light emitting device according to claim 7, wherein a side surface of the film is coplanar with a side surface of the first electrode.

12. A method for manufacturing a light emitting device comprising the steps of:
    forming a thin film transistor over a substrate;
    forming an insulating layer over the thin film transistor;
    forming a film over the insulating layer;
    forming a contact hole through the insulating layer and the film;
    forming a first electrode over the film, the first electrode being electrically connected to the thin film transistor through the contact hole;
    forming a second electrode being electrically connected to the first electrode;
    removing a part of the film by using the second electrode as a mask;
    forming a bank over the second electrode so as to cover an edge of the film and the second electrode;
    performing a heat treatment to the insulating layer;
    forming a light emitting layer over the second electrode; and
    forming a third electrode over the light emitting layer.

13. The method for manufacturing a light emitting device according to claim 12, wherein the heat treatment is performed in a vacuum.

14. The method for manufacturing a light emitting device according to claim 12, wherein the light emitting film and the third electrode are formed without exposing to atmospheric air after performing the heat treatment.

15. The method for manufacturing a light emitting device according to claim 12, wherein the film is a silicon nitride film.

16. The method for manufacturing a light emitting device according to claim 12, wherein a side surface of the film is coplanar with a side surface of the second electrode.

* * * * *